United States Patent [19]
Kato et al.

[11] Patent Number: 5,831,480
[45] Date of Patent: Nov. 3, 1998

[54] OPERATIONAL AMPLIFIER ADOPTED FOR INPUT AND OUTPUT IN WIDE RANGES FOR DRIVING A LARGE LOAD

[75] Inventors: Fumihiko Kato; Michio Yotsuyanagi, both of Tokyo, Japan

[73] Assignee: NEC Corporation, Tokyo, Japan

[21] Appl. No.: 719,558

[22] Filed: Sep. 25, 1996

[30] Foreign Application Priority Data

Sep. 25, 1995 [JP] Japan ................................ 7-271810

[51] Int. Cl.$^6$ ............................................. H03F 3/45
[52] U.S. Cl. ........................ 330/253; 330/255; 330/257
[58] Field of Search .................................. 330/253, 255, 330/257

[56] References Cited

U.S. PATENT DOCUMENTS

| | | | |
|---|---|---|---|
| 4,335,355 | 6/1982 | Haque | 330/255 X |
| 4,800,339 | 1/1989 | Tanimoto | 330/255 X |
| 5,650,753 | 7/1997 | Ling | 330/255 X |

*Primary Examiner*—James B. Mullins
*Attorney, Agent, or Firm*—Young & Thompson

[57] ABSTRACT

An operational amplifier comprises an input stage, an output stage, and an intermediate circuitry connected between the input stage and the output stage. The operational amplifier may be biased between a high voltage line and a low voltage line. The input stage includes at least an amplifier circuit. The intermediate circuitry comprises at least a first pair of a first transistor and a first constant current source, both of which are connected in series to each other between the high voltage line and the low voltage line. The first pair may be adjacent to the output stage. A first intermediate point between the first transistor and the first constant current source may be connected to the output stage. At least a second pair of a second transistor and a second constant current source is provided, both of which are connected in series to each other between the high voltage line and the low voltage line. The second pair may be in parallel to the first pair and may be adjacent to the input stage. A second intermediate point between the second transistor and the second constant current source may be connected to a control electrode of the first transistor the output stage. A control gate of the second transistor may be connected to the input stage.

71 Claims, 20 Drawing Sheets

OPERATIONAL AMPLIFIER ADOPTED FOR INPUT AND OUTPUT IN WIDE RANGES FOR DRIVING A LARGE LOAD

BACKGROUND OF THE INVENTION

The present invention relates to an operational amplifier adopted for input and output in wide ranges and for driving a large load.

It had been required to improve the conventional operational amplifier circuits adopted for input and output in wide ranges and for driving a large load. Particularly, it had been required to develop an improved operational amplifier which shows high performance. Further, it had been required to develop an improved operational amplifier which has wide input and output ranges. Furthermore, it had been required to develop an improved operational amplifier which shows rapid rising up and drop of the potential of the output terminal. Still further, it had been required to develop an improved operational amplifier wherein the idling current is free from any influence of variations in absolute threshold values of the transistors. Yet further, it had been required to develop an improved operational amplifier which is capable of suppressing any punch through current in response to the discharge current flowing in the discharge operation over the operational amplifier.

SUMMARY OF THE INVENTION

Accordingly, it is an object of the present invention to provide a novel operational amplifier which shows high performance.

It is a further object of the present invention to provide a novel operational amplifier which has wide input and output ranges.

It is a furthermore object of the present invention to provide a novel operational amplifier which shows rapid rising up and drop of the potential of the output terminal.

It is a still further object of the present invention to provide a novel operational amplifier wherein the idling current is free from any influence of variations in absolute threshold values of the transistors.

It is yet a further object of the present invention to provide a novel operational amplifier which is capable of suppressing any punch through current in response to the discharge current flowing in the discharge operation over the operational amplifier.

The above and other objects, features and advantages of the present invention will be apparent from the following descriptions.

The present invention provides an intermediate circuitry connected between an input stage and an output stage in an operational amplifier. The input stage and the output stage are biased between a high voltage line and a low voltage line. The intermediate circuitry is also biased between the high voltage line and the low voltage line. The intermediate circuitry comprises the following elements. At least a first pair of a first transistor and a first constant current source are provided, both of which are connected in series to each other between the high voltage line and the low voltage line. The first pair is adjacent to the output stage. A first intermediate point between the first transistor and the first constant current source is connected to the output stage. At least a second pair of a second transistor and a second constant current source are provided, both of which are connected in series to each other between the high voltage line and the low voltage line. The second pair is in parallel to the first pair and is adjacent to the input stage. A second intermediate point between the second transistor and the second constant current source is connected to a control electrode of the first transistor in the output stage. A control gate of the second transistor is connected to the input stage.

The present invention provides an operational amplifier comprising an input stage, an output stage, and an intermediate circuitry connected between the input stage and the output stage. The operational amplifier may be biased between a high voltage line and a low voltage line. The input stage includes at least an amplifier circuit. The intermediate circuitry comprises at least a first pair of a first transistor and a first constant current source, both of which are connected in series to each other between the high voltage line and the low voltage line. The first pair may be adjacent to the output stage. A first intermediate point between the first transistor and the first constant current source may be connected to the output stage. At least a second pair of a second transistor and a second constant current source is provided, both of which are connected in series to each other between the high voltage line and the low voltage line. The second pair may be in parallel to the first pair and may be adjacent to the input stage. A second intermediate point between the second transistor and the second constant current source may be connected to a control electrode of the first transistor the output stage. A control gate of the second transistor may be connected to the input stage.

BRIEF DESCRIPTIONS OF THE DRAWINGS

Preferred embodiments of the present invention will be described in detail with reference to the accompanying drawings.

DISCLOSURE OF THE INVENTION

Figure 1:
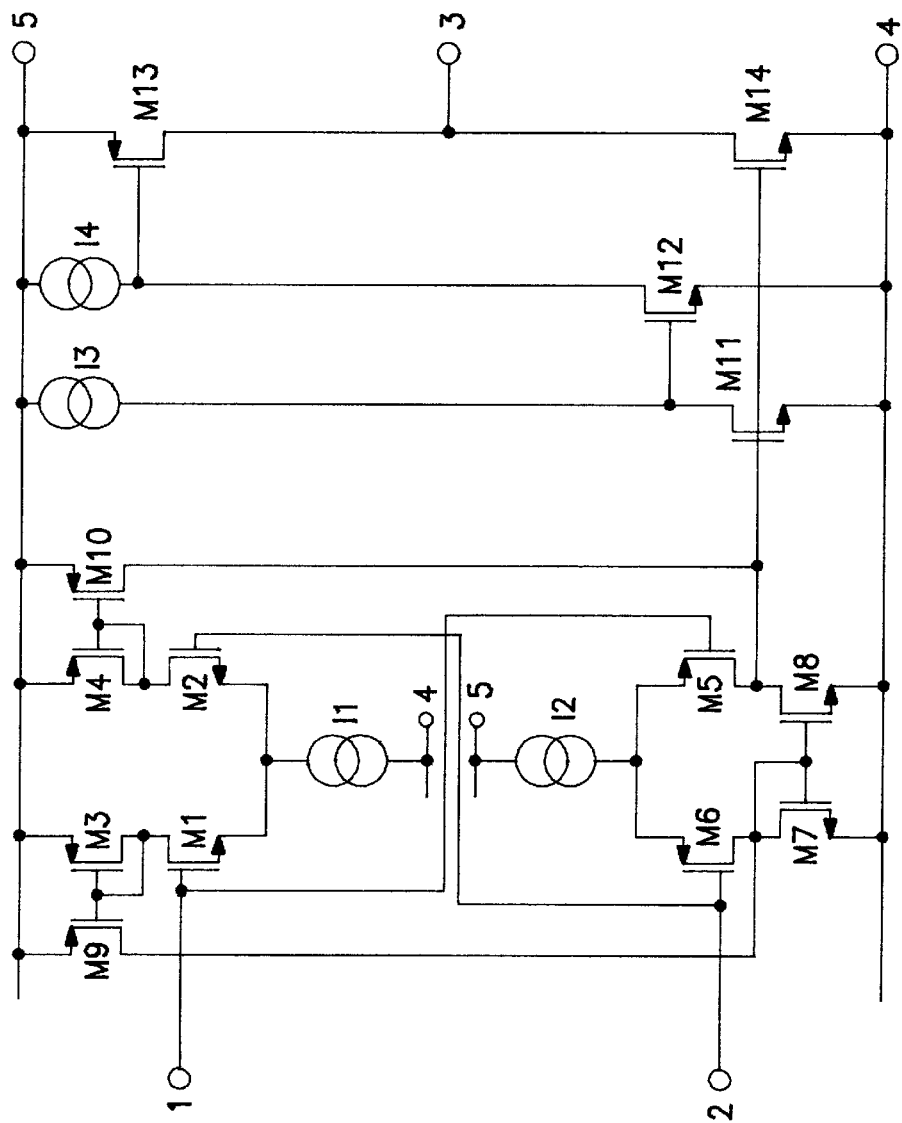
FIG. 1 is a circuit diagram illustrative of an improved operational amplifier in a first embodiment according to the present invention.

The present invention provides an intermediate circuitry connected between an input stage and an output stage in an operational amplifier. The input stage and the output stage are biased between a high voltage line and a low voltage line. The intermediate circuitry is also biased between the high voltage line and the low voltage line. The intermediate circuitry comprises the following elements. At least a first pair of a first transistor and a first constant current source are provided, both of which are connected in series to each other between the high voltage line and the low voltage line. The first pair is adjacent to the output stage. A first intermediate point between the first transistor and the first constant current source is connected to the output stage. At least a second pair of a second transistor and a second constant current source are provided, both of which are connected in series to each other between the high voltage line and the low voltage line. The second pair is in parallel to the first pair and is adjacent to the input stage. A second intermediate point between the second transistor and the second constant current source is connected to a control electrode of the first transistor the output stage. A control gate of the second transistor is connected to the input stage.

It is preferable that the output stage comprises a complementary MOS circuit having an p-channel MOS transistor and a n-channel MOS transistor, both of which are connected in series to each other between the high voltage line and the low voltage line, the p-channel MOS transistor is connected to the high voltage line, and the n-channel MOS transistor is connected to the low voltage line, and also that the input stage includes at least a differential amplifier circuit.

In the above case, the first transistor may comprise a n-channel MOS transistor having a source connected to the low voltage line, and a drain connected to the first constant current source and also connected to a gate of the p-channel MOS transistor in the output stage. The first constant current source may be connected to the high voltage line. The second transistor may comprise a n-channel MOS transistor having a source connected to the low voltage line, a drain connected to the second constant current source and also connected to a gate of the n-channel MOS transistor as the first transistor and a gate connected to the input stage and also connected to a gate of the n-channel MOS transistor in the output stage. The second constant current source may be connected to the high voltage line.

In the above case, the input stage may comprise a first input terminal for receiving first input signals, a second input terminal for receiving second input signals, a first differential amplifier circuit being connected to the first input terminal and the second input terminal. The first differential amplifier circuit is biased between the high voltage line and the low voltage line. An output of the first differential amplifier may be connected to the gate of the second transistor of the intermediate circuitry and also connected to the n-channel MOS transistor in the output stage. The input stage may further comprise a second differential amplifier circuit being connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

Alternatively, the first transistor may be arranged as follows. A p-channel MOS transistor is provided, having a source connected to the high voltage line, and a drain connected to the first constant current source and also connected to a gate of the p-channel MOS transistor in the output stage. The first constant current source may be connected to the low voltage line. The second transistor may comprise an n-channel MOS transistor having a source connected to the low voltage line, a drain connected to the second constant current source and also connected to a gate of the p-channel MOS transistor as the first transistor and a gate connected to the input stage and also connected to a gate of the n-channel MOS transistor in the output stage. The second constant current source may be connected to the high voltage line.

In the above case, the input stage may comprise the following. A first input terminal is provided for receiving first input signals and a second input terminal is also provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

Alternatively, the first transistor may comprise an p-channel MOS transistor having a source connected to the high voltage line, and a drain connected to the first constant current source and also connected to a gate of the p-channel MOS transistor in the output stage. The first constant current source may be connected to the low voltage line. The second transistor may comprise a p-channel MOS transistor having a source connected to the high voltage line, a drain connected to the second constant current source and also connected to a gate of the p-channel MOS transistor as the first transistor and a gate connected to the input stage and also connected to a gate of the p-channel MOS transistor in the output stage. The second constant current source may be connected to the low voltage line.

In the above, case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

Alternatively, the first transistor may comprise an n-channel MOS transistor having a source connected to the low voltage line, and a drain connected to the first constant current source and also connected to a gate of the n-channel MOS transistor in the output stage. The first constant current source may be connected to the high voltage line. The second transistor may comprise an p-channel MOS transistor having a source connected to the high voltage line, a drain connected to the second constant current source and also connected to a gate of the n-channel MOS transistor as the first transistor and a gate connected to the input stage and also connected to a gate of the p-channel MOS transistor in the output stage. The second constant current source may be connected to the low voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

Alternatively, the output stage may comprise a p-channel MOS transistor and an n-p-n bipolar transistor, both of which are connected in series to each other between the high voltage line and the low voltage line. The p-channel MOS transistor may be connected to the high voltage line and the n-p-n bipolar transistor may be connected to the low voltage line.

In the above case, the first transistor may comprise a n-channel MOS transistor having a source connected to the low voltage line, and a drain connected to the first constant current source and also connected to a gate of the p-channel MOS transistor in the output stage. The first constant current source may be connected to the high voltage line. The second transistor may comprise an n-p-n bipolar transistor having an emitter connected to the low voltage line, a collector connected to the second constant current source and also connected to a gate of the n-channel MOS transistor as the first transistor and a base connected to the input stage and also connected to a base of the n-p-n bipolar transistor in the output stage. The second constant current source may be connected to the high voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the n-p-n bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the n-p-n bipolar transistor in the output stage.

Alternatively, the first transistor may comprise an p-channel MOS transistor having a source connected to the high voltage line, and a drain connected to the first constant current source and also connected to a gate of the p-channel MOS transistor in the output stage. The first constant current source may be connected to the low voltage line. The second transistor may comprise an n-p-n bipolar transistor having an emitter connected to the low voltage line, a collector connected to the second constant current source and also connected to a gate of the p-channel MOS transistor as the first transistor and a base connected to the input stage and also connected to a base of the n-p-n bipolar transistor in the output stage. The second constant current source may be connected to the high voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the n-p-n bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the n-p-n bipolar transistor in the output stage.

Alternatively, the output stage may comprise an n-channel MOS transistor and a p-n-p bipolar transistor, both of which are connected in series to each other between the high voltage line and the low voltage line. The n-channel MOS transistor may be connected to the low voltage line and the p-n-p bipolar transistor may be connected to the high voltage line.

In the above case, the first transistor may comprise a p-channel MOS transistor having a source connected to the high voltage line, and a drain connected to the first constant current source and also connected to a gate of the n-channel MOS transistor in the output stage. The first constant current source may be connected to the low voltage line. The second transistor may comprise a p-n-p bipolar transistor having an emitter connected to the high voltage line, a drain connected to the second constant current source and also connected to a gate of the p-channel MOS transistor as the first transistor and a base connected to the input stage and also connected to a base of the p-n-p bipolar transistor in the output stage, The second constant current source may be connected to the low voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the p-n-p bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the p-n-p bipolar transistor in the output stage.

Alternatively, the first transistor may comprise an n-channel MOS transistor having a source connected to the low voltage line, and a drain connected to the first constant current source and also connected to a gate of the n-channel MOS transistor in the output stage. The first constant current source may be connected to the high voltage line. The second transistor may comprise a p-n-p bipolar transistor having an emitter connected to the high voltage line, a collector connected to the second constant current source and also connected to a gate of the n-channel MOS transistor as the first transistor and a base connected to the input stage and also connected to a base of the p-n-p bipolar transistor in the output stage,. The second constant current source may be connected to the low voltage line.

In the above case, the input stage may comprise as follows. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the p-n-p bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the p-n-p bipolar transistor in the output stage.

Alternatively, the output stage may comprise a complementary MOS circuit having a p-channel MOS transistor and an n-channel MOS transistor, both of which are connected in series to each other between the high voltage line and the low voltage line. The p-channel MOS transistor may be connected to the high voltage line, and the n-channel MOS transistor may be connected to the low voltage line, The input stage may include at least a differential amplifier circuit. The first transistor may comprise a n-channel MOS transistor having a source connected to the low voltage line, and a drain connected to the first constant current source and also connected to a gate of the p-channel MOS transistor in the output stage. The first constant current source may be connected to the high voltage line. The second transistor may comprise a n-channel MOS transistor having a source connected to the low voltage line, a drain connected to the second constant current source and also connected to a gate of the n-channel MOS transistor as the first transistor and a gate connected to the input stage and also connected to a gate of the n-channel MOS transistor in the output stage. The second constant current source may be connected to the high voltage line. The intermediate circuitry may farther comprise a first additional n-channel MOS transistor having a source connected to the source of the n-channel MOS transistor as the second transistor, a drain connected to the drain of the n-channel MOS transistor as the second transistor, and a gate connected to the gate of the n-channel MOS transistor as the first transistor and also connected to the drain of the n-channel MOS transistor as the second transistor.

In the above case, the input stage may comprise. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

A first additional p-channel MOS transistor may further be provided, having a source connected to the first constant current source, a drain connected to the drain of the n-channel MOS transistor as the first transistor, and a gate connected to the gate of the p-channel MOS transistor in the output stage.

A second additional n-channel MOS transistor may further be provided having a source connected to the source of the n-channel MOS transistor as the first transistor, a drain connected to the drain of the n-channel MOS transistor as the first transistor, and a gate connected to the drain of the n-channel MOS transistor as the first transistor.

Alternatively, the output stage may comprise a complementary MOS circuit having an p-channel MOS transistor and a n-channel MOS transistor, both of which are connected in series to each other between the high voltage line and the low voltage line. The p-channel MOS transistor may be connected to the high voltage line, and the n-channel MOS transistor may be connected to the low voltage line. The input stage may include at least a differential amplifier circuit. The first transistor may comprise an p-channel MOS transistor having a source connected to the high voltage line, and a drain connected to the first constant current source and also connected to a gate of the p-channel MOS transistor in the output stage. The first constant current source may be connected to the low voltage line. The second transistor may comprise an n-channel MOS transistor having a source connected to the low voltage line, a drain connected to the second constant current source and also connected to a gate of the p-channel MOS transistor as the first transistor and a gate connected to the input stage and also connected to a gate of the n-channel MOS transistor in the output stage. The second constant current source may be connected to the high voltage line. The intermediate circuitry may further comprise a first additional p-channel MOS transistor having a source connected to the source of the p-channel MOS transistor as the first transistor, a drain connected to the drain of the p-channel MOS transistor as the first transistor, and a gate connected to the gate of the p-channel MOS transistor in the output stage and also connected to the drain of the p-channel MOS transistor as the first transistor.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

The present invention provides an operational amplifier comprising an input stage, an output stage, and an intermediate circuitry connected between the input stage and the output stage. The operational amplifier may be biased between a high voltage line and a low voltage line. The input stage includes at least an amplifier circuit. The intermediate circuitry comprises at least a first pair of a first transistor and a first constant current source, both of which are connected in series to each other between the high voltage line and the low voltage line. The first pair may be adjacent to the output stage. A first intermediate point between the first transistor and the first constant current source may be connected to the output stage. At least a second pair of a second transistor and a second constant current source is provided, both of which are connected in series to each other between the high voltage line and the low voltage line. The second pair may be in parallel to the first pair and may be adjacent to the input stage. A second intermediate point between the second transistor and the second constant current source may be connected to a control electrode of the first transistor the output stage. A control gate of the second transistor may be connected to the input stage.

The amplifier circuit in the input stage may comprise a differential amplifier circuit.

The output stage may comprise a complementary MOS circuit having an p-channel MOS transistor and a n-channel MOS transistor, both of which are connected in series to each other between the high voltage line and the low voltage line. The p-channel MOS transistor may be connected to the high voltage line, and the n-channel MOS transistor may be connected to the low voltage line. The input stage includes at least a differential amplifier circuit.

In the above case, the first transistor may comprise an n-channel MOS transistor having a source connected to the low voltage line, and a drain connected to the first constant current source and also connected to a gate of the p-channel MOS transistor in the output stage. The first constant current source may be connected to the high voltage line. The second transistor may comprise an n-channel MOS transistor having a source connected to the low voltage line, a drain connected to the second constant current source and also connected to a gate of the n-channel MOS transistor as the first transistor and a gate connected to the input stage and also connected to a gate of the n-channel MOS transistor in the output stage. The second constant current source may be connected to the high voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

The first differential amplifier circuit may comprise the following. A first differential transistor pair of first and second n-channel MOS transistors connected to each other via sources thereof which may be connected via a constant current source to the low voltage line. A gate of the first n-channel MOS transistor of the first differential transistor pair may be connected to the first input terminal. A gate of the second n-channel MOS transistor of the first differential transistor pair may be connected to the second input terminal. A first current mirror circuit may comprise a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair. The second p-channel MOS transistor has a source connected to the high voltage line, a drain connected to the second differential amplifier circuit, and a gate connected to the gate of the first n-channel MOS transistor of the first differential transistor pair. A second current mirror circuit may comprise a pair of third and fourth p-channel MOS transistors. The third p-channel MOS transistor may have a source connected to the high voltage line, a drain connected to a drain of the second n-channel MOS transistor of the first differential transistor pair, and a gate connected to the drain of the second n-channel MOS transistor of the first differential transistor pair, and the fourth p-channel MOS transistor having a source connected to the high voltage line, a drain connected to the second differential amplifier circuit and also connected to the gate of the n-channel MOS transistor as the second transistor of the intermediate circuitry, and a gate connected to the gate of the second n-channel MOS transistor of the first differential transistor pair. The second differential amplifier circuit comprise a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair. The second n-channel MOS transistor has a source connected to the low voltage line, a drain connected to a drain of the second p-channel MOS transistor of the second differential transistor pair and also connected to the gate of the n-channel MOS transistor as the second transistor of the intermediate circuitry, and a gate connected to the gate of the first p-channel MOS transistor of the second differential transistor pair.

The first differential amplifier circuit may comprise a first differential transistor pair of first and second n-p-n bipolar transistors connected to each other via emitters thereof which are connected via a constant current source to the low voltage line. A base of the first n-p-n bipolar transistor of the first differential transistor pair may be connected to the first input terminal. A base of the second n-p-n bipolar transistor of the first differential transistor pair may be connected to the second input terminal. A first current mirror circuit comprises a pair of first and second p-channel MOS transistors. The first p-channel MOS transistor has a source connected to the high voltage line, a drain connected to a collector of the first n-p-n bipolar transistor of the first differential transistor pair, and a gate connected to the collector of the first n-p-n bipolar transistor of the first differential transistor pair. The second p-channel MOS transistor has a source connected to the high voltage line, a drain connected to the second differential amplifier circuit, and a gate connected to the collector of the first n-p-n bipolar transistor of the first differential transistor pair. A second current mirror circuit comprises a pair of third and fourth p-channel MOS transistors. The third p-channel MOS transistor has a source connected to the high voltage line, a drain connected to a collector of the second n-p-n bipolar transistor of the first differential transistor pair, and a gate connected to the collector of the second n-p-n bipolar transistor of the first differential transistor pair. The fourth p-channel MOS transistor has a source connected to the high voltage line, a drain connected to the second differential amplifier circuit and also connected to the gate of the n-channel MOS transistor as the second transistor of the intermediate circuitry, and a gate connected to the collector of the second n-p-n bipolar transistor of the first differential transistor pair. The second differential amplifier circuit may comprise a second differential transistor pair of first and second p-n-p bipolar transistors connected to each other via emitters thereof which are connected via a constant current source to the high voltage line. A base of the first p-n-p bipolar transistor of the second differential transistor pair may be connected to the second input terminal. A gate of the second p-n-p bipolar transistor of the second differential transistor pair may be connected to the first input terminal. A third current mirror circuit comprises a pair of first and second n-channel MOS transistors. The first n-channel MOS transistor has a source connected to the low voltage line, a drain connected to a collector of the first p-n-p bipolar transistor of the second differential transistor pair, a gate connected to the collector of the first p-n-p bipolar transistor of the second differential transistor pair. The second n-channel MOS transistor has a source connected to the low voltage line, a drain connected to a collector of the second p-n-p bipolar transistor of the second differential transistor pair and also connected to the gate of the n-channel MOS transistor as the second transistor of the intermediate circuitry, and a gate connected to the collector of the first p-n-p bipolar transistor of the second differential transistor pair.

Alternatively, the first transistor may comprise a p-channel MOS transistor having a source connected to the high voltage line, and a drain connected to the first constant current source and also connected to a gate of the p-channel MOS transistor in the output stage. The first constant current source may be connected to the low voltage line. The second transistor comprises a n-channel MOS transistor having a source connected to the low voltage line, a drain connected to the second constant current source and also connected to a gate of the p-channel MOS transistor as the first transistor and a gate connected to the input stage and also connected to a gate of the n-channel MOS transistor in the output stage. The second constant current source may be connected to the high voltage line.

In the above case, the input stage may comprise as follows. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

In the above case, the first differential amplifier circuit may comprise a first differential transistor pair of first and second n-channel MOS transistors connected to each other via sources thereof which are connected via a constant current source to the low voltage line, a gate of the first n-channel MOS transistor of the first differential transistor pair may be connected to the first input terminal, a gate of the second n-channel MOS transistor of the first differential transistor pair may be connected to the second input terminal. A first current mirror circuit comprises a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair. The second p-channel MOS transistor has a source connected to the high voltage line, a drain connected to the second differential amplifier circuit, and a gate connected to the gate of the first n-channel MOS transistor of the first differential transistor pair. A second current mirror circuit comprises a pair of third and fourth p-channel MOS transistors. The third p-channel MOS transistor has a source connected to the high voltage line, a drain connected to a drain of the second n-channel MOS transistor of the first differential transistor pair, and a gate connected to the drain of the second n-channel MOS transistor of the first differential transistor pair. The fourth p-channel MOS transistor has a source connected to the high voltage line, a drain connected to the second differential amplifier circuit and also connected to the gate of the n-channel MOS transistor as the second transistor of the intermediate circuitry, and a gate connected to the gate of the second n-channel MOS transistor of the first differential transistor pair. The second differential amplifier circuit comprises a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair. The second n-channel MOS transistor has a source connected to the low voltage line, a drain connected to a drain of the second p-channel MOS transistor of the second differential transistor pair and also connected to the gate of the n-channel MOS transistor as the second transistor of the intermediate circuitry, and a gate connected to the gate of the first p-channel MOS transistor of the second differential transistor pair.

Alternatively, the first differential amplifier circuit comprises a first differential transistor pair of first and second n-p-n bipolar transistors connected to each other via emitters thereof which are connected via a constant current source to the low voltage line, a base of the first n-p-n bipolar transistor of the first differential transistor pair may be connected to the first input terminal, a base of the second n-p-n bipolar transistor of the first differential transistor pair may be connected to the second input terminal. A first current mirror circuit comprises a pair of first and second p-channel MOS transistors. The first p-channel MOS transistor has a source connected to the high voltage line, a drain connected to a collector of the first n-p-n bipolar transistor of the first differential transistor pair, and a gate connected to the collector of the first n-p-n bipolar transistor of the first differential transistor pair. The second p-channel MOS transistor has a source connected to the high voltage line, a drain connected to the second differential amplifier circuit, and a gate connected to the collector of the first n-p-n bipolar transistor of the first differential transistor pair. A second current mirror circuit comprises a pair of third and fourth p-channel MOS transistors. The third p-channel MOS transistor has a source connected to the high voltage line, a drain connected to a collector of the second n-p-n bipolar transistor of the first differential transistor pair, and a gate connected to the collector of the second n-p-n bipolar transistor of the first differential transistor pair. The fourth p-channel MOS transistor has a source connected to the high voltage line, a drain connected to the second differential amplifier circuit and also connected to the gate of the n-channel MOS transistor as the second transistor of the intermediate circuitry, and a gate connected to the collector of the second n-p-n bipolar transistor of the first differential transistor pair. The second differential amplifier circuit may comprise a second differential transistor pair of first and second p-n-p bipolar transistors connected to each other via emitters thereof which are connected via a constant current source to the high voltage line. A base of the first p-n-p bipolar transistor of the second differential transistor pair may be connected to the second input terminal. A gate of the second p-n-p bipolar transistor of the second differential transistor pair may be connected to the first input terminal. A third current mirror circuit comprises a pair of first and second n-channel MOS transistors. The first n-channel MOS transistor has a source connected to the low voltage line, a drain connected to a collector of the first p-n-p bipolar transistor of the second differential transistor pair, a gate connected to the collector of the first p-n-p bipolar transistor of the second differential transistor pair. The second n-channel MOS transistor has a source connected to the low voltage line, a drain connected to a collector of the second p-n-p bipolar transistor of the second differential transistor pair and also connected to the gate of the n-channel MOS transistor as the second transistor of the intermediate circuitry, and a gate connected to the collector of the first p-n-p bipolar transistor of the second differential transistor pair.

Alternatively, the first transistor comprises an p-channel MOS transistor having a source connected to the high voltage line, and a drain connected to the first constant current source and also connected to a gate of the p-channel MOS transistor in the output stage. The first constant current source may be connected to the low voltage line. The second transistor may comprise a p-channel MOS transistor having a source connected to the high voltage line, a drain connected to the second constant current source and also connected to a gate of the p-channel MOS transistor as the first transistor and a gate connected to the input stage and also connected to a gate of the p-channel MOS transistor in the output stage. The second constant current source may be connected to the low voltage line.

In the above case, the input stage may comprise the following. A first input terminal is for receiving first input signals. A second input terminal is for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

In the above case, the first differential amplifier circuit comprises a first differential transistor pair of first and second p-channel MOS transistors connected to each other via sources thereof which are connected via a constant current source to the high voltage line. A gate of the first p-channel MOS transistor of the first differential transistor pair may be connected to the first input terminal. A gate of the second p-channel MOS transistor of the first differential transistor pair may be connected to the second input terminal. A first current mirror circuit comprises a pair of first and second n-channel MOS transistors. The first n-channel MOS transistor has a source connected to the low voltage line, a drain connected to a drain of the first p-channel MOS transistor of the first differential transistor pair, and a gate connected to the drain of the first p-channel MOS transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth p-channel MOS transistors. The third n-channel MOS transistor has a source connected to the low voltage line, a drain connected to a drain of the second p-channel MOS transistor of the first differential transistor pair, and a gate connected to the drain of the second p-channel MOS transistor of the first differential transistor pair. The fourth n-channel MOS transistor has a source connected to the low voltage line, a drain connected to the second differential amplifier circuit and also connected to the gate of the p-channel MOS transistor as the second transistor of the intermediate circuitry, and a gate connected to the gate of the second n-channel MOS transistor of the second current mirror circuit. The second differential amplifier circuit comprises a second differential transistor pair of first and second n-channel MOS transistors connected to each other via sources thereof which are connected via a constant current source to the low voltage line. A gate of the first n-channel MOS transistor of the second differential transistor pair may be connected to the second input terminal, a gate of the second n-channel MOS transistor of the second differential transistor pair may be connected to the first input terminal. A third current mirror circuit comprises a pair of first and second p-channel MOS transistors. The first p-channel MOS transistor has a source connected to the high voltage line, a drain connected to a drain of the first n-channel MOS transistor of the second differential transistor pair, a gate connected to the drain of the first n-channel MOS transistor of the second differential transistor pair, and the second p-channel MOS transistor having a source connected to the high voltage line, a drain connected to a drain of the second n-channel MOS transistor of the second differential transistor pair and also connected to the gate of the p-channel MOS transistor as the second transistor of the intermediate circuitry, and a gate connected to the gate of the first n-channel MOS transistor of the second differential transistor pair.

In the above case, the first differential amplifier circuit comprises a first differential transistor pair of first and second p-n-p bipolar transistors connected to each other via emitters thereof which are connected via a constant current source to the high voltage line. A base of the first n-p-n bipolar transistor of the first differential transistor pair may be connected to the first input terminal. A base of the second n-p-n bipolar transistor of the first differential transistor pair may be connected to the second input terminal. A first current mirror circuit comprises a pair of first and second n-channel MOS transistors. The first n-channel MOS transistor has a source connected to the low voltage line, a drain connected to a collector of the first p-n-p bipolar transistor of the first differential transistor pair, and a gate connected to the collector of the first p-n-p bipolar transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth n-channel MOS transistors. The third n-channel MOS transistor has a source connected to the low voltage line, a drain connected to a collector of the second p-n-p bipolar transistor of the first differential transistor pair, and a gate connected to the collector of the second p-n-p bipolar transistor of the first differential transistor pair. The fourth n-channel MOS transistor has a source connected to the low voltage line, a drain connected to the second differential amplifier circuit and also connected to the gate of the p-channel MOS transistor as the second transistor of the intermediate circuitry, and a gate connected to the gate of the first n-channel MOS transistor of the second current mirror circuit. The second differential amplifier circuit comprises a second differential transistor pair of first and second n-p-n bipolar transistors connected to each other via emitters thereof which are connected via a constant current source to the low voltage line. A base of the first n-p-n bipolar transistor of the second differential transistor pair may be connected to the second input terminal A base of the second n-p-n bipolar transistor of the second differential transistor pair may be connected to the first input terminal. A third current mirror circuit comprises a pair of first and second p-channel MOS transistors. The first p-channel MOS transistor has a source connected to the high voltage line, a drain connected to a collector of the first n-p-n bipolar transistor of the second differential transistor pair, a gate connected to the collector of the first n-p-n bipolar transistor of the second differential transistor pair. The second p-channel MOS transistor having a source connected to the high voltage line, a drain connected to a collector of the second n-p-n bipolar transistor of the second differential transistor pair and also connected to the gate of the p-channel MOS transistor as the second transistor of the intermediate circuitry, and a gate connected to the gate of the first p-channel MOS transistor of the third current mirror circuit.

The first transistor may comprise a n-channel MOS transistor having a source connected to the low voltage line, and a drain connected to the first constant current source and also connected to a gate of the n-channel MOS transistor in the output stage. The first constant current source may be connected to the high voltage line. The second transistor comprises a p-channel MOS transistor has a source connected to the high voltage line, a drain connected to the second constant current source and also connected to a gate of the n-channel MOS transistor as the first transistor and a gate connected to the input stage and also connected to a gate of the p-channel MOS transistor in the output stage. The second constant current source may be connected to the low voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage The first differential amplifier circuit may comprise a first differential transistor pair of first and second p-channel MOS transistors connected to each other via sources thereof which are connected via a constant current source to the high voltage line. A gate of the first p-channel MOS transistor of the first differential transistor pair may be connected to the first input terminal. A gate of the second p-channel MOS transistor of the first differential transistor pair may be connected to the second input terminal. A first current mirror circuit comprises a pair of first and second n-channel MOS transistors. The first n-channel MOS transistor has a source connected to the low voltage line, a drain connected to a drain of the first p-channel MOS transistor of the first differential transistor pair, and a gate connected to the drain of the first p-channel MOS transistor of the first differential transistor pair. The second n-channel MOS transistor has a source connected to the low voltage line, a drain connected to the second differential amplifier circuit, and a gate connected to the gate of the first p-channel MOS transistor of the first differential transistor pair. A second current mirror circuit comprises a pair of third and fourth p-channel MOS transistors. The third n-channel MOS transistor has a source connected to the low voltage line, a drain connected to a drain of the second p-channel MOS transistor of the first differential transistor pair, and a gate connected to the drain of the second p-channel MOS transistor of the first differential transistor pair. The fourth n-channel MOS transistor has a source connected to the low voltage line, a drain connected to the second differential amplifier circuit and also connected to the gate of the p-channel MOS transistor as the second transistor of the intermediate circuitry, and a gate connected to the gate of the second p-channel MOS transistor of the first differential transistor pair. The second differential amplifier circuit comprises a second differential transistor pair of first and second n-channel MOS transistors connected to each other via sources thereof which are connected via a constant current source to the low voltage line. A gate of the first n-channel MOS transistor of the second differential transistor pair may be connected to the second input terminal. A gate of the second n-channel MOS transistor of the second differential transistor pair may be connected to the first input terminal. A third current mirror circuit comprises a pair of first and second p-channel MOS transistors. The first p-channel MOS transistor has a source connected to the high voltage line, a drain connected to a drain of the first n-channel MOS transistor of the second differential transistor pair, a gate connected to the drain of the first n-channel MOS transistor of the second differential transistor pair. The second p-channel MOS transistor has a source connected to the high voltage line, a drain connected to a drain of the second n-channel MOS transistor of the second differential transistor pair and also connected to the gate of the p-channel MOS transistor as the second transistor of the intermediate circuitry, and a gate connected to the gate of the first n-channel MOS transistor of the second differential transistor pair.

In the above case, the first differential amplifier circuit comprises a first differential transistor pair of first and second p-n-p bipolar transistors connected to each other via emitters thereof which are connected via a constant current source to the high voltage line. A base of the first n-p-n bipolar transistor of the first differential transistor pair may be connected to the first input terminal. A base of the second n-p-n bipolar transistor of the first differential transistor pair may be connected to the second input terminal. A first current mirror circuit comprises a pair of first and second n-channel MOS transistors. The first n-channel MOS transistor has a source connected to the low voltage line, a drain connected to a collector of the first p-n-p bipolar transistor of the first differential transistor pair, and a gate connected to the collector of the first p-n-p bipolar transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth n-channel MOS transistors. The third n-channel MOS transistor has a source connected to the low voltage line, a drain connected to a collector of the second p-n-p bipolar transistor of the first differential transistor pair, and a gate connected to the collector of the second p-n-p bipolar transistor of the first differential transistor pair. The fourth n-channel MOS transistor has a source connected to the low voltage line, a drain connected to the second differential amplifier circuit and also connected to the gate of the p-channel MOS transistor as the second transistor of the intermediate circuitry, and a gate connected to the gate of the first n-channel MOS transistor of the second current mirror circuit. The second differential amplifier circuit comprises a second differential transistor pair of first and second n-p-n bipolar transistors connected to each other via emitters thereof which are connected via a constant current source to the low voltage line. A base of the first n-p-n bipolar transistor of the second differential transistor pair may be connected to the second input terminal. A base of the second n-p-n bipolar transistor of the second differential transistor pair may be connected to the first input terminal. A third current mirror circuit comprises a pair of first and second p-channel MOS transistors. The first p-channel MOS transistor has a source connected to the high voltage line, a drain connected to a collector of the first n-p-n bipolar transistor of the second differential transistor pair, a gate connected to the collector of the first n-p-n bipolar transistor of the second differential transistor pair. The second p-channel MOS transistor has a source connected to the high voltage line, a drain connected to a collector of the second n-p-n bipolar transistor of the second differential transistor pair and also connected to the gate of the p-channel MOS transistor as the second transistor of the intermediate circuitry, and a gate connected to the gate of the first p-channel MOS transistor of the third current mirror circuit.

Alternatively, the output stage comprises a p-channel MOS transistor and an n-p-n bipolar transistor, both of which are connected in series to each other between the high voltage line and the low voltage line. The p-channel MOS transistor may be connected to the high voltage line and the n-p-n bipolar transistor is connected to the low voltage line.

The first transistor may comprise a n-channel MOS transistor having a source connected to the low voltage line, and a drain connected to the first constant current source and also connected to a gate of the p-channel MOS transistor in the output stage. The first constant current source may be connected to the high voltage line. The second transistor comprises an n-p-n bipolar transistor having an emitter connected to the low voltage line, a collector connected to the second constant current source and also connected to a gate of the n-channel MOS transistor as the first transistor and a base connected to the input stage and also connected to a base of the n-p-n bipolar transistor in the output stage. The second constant current source may be connected to the high voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the n-p-n bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the n-p-n bipolar transistor in the output stage.

In the above case, the first differential amplifier circuit comprises a first differential transistor pair of first and second n-channel MOS transistors connected to each other via sources thereof which are connected via a constant current source to the low voltage line, a gate of the first n-channel MOS transistor of the first differential transistor pair may be connected to the first input terminal, a gate of the second n-channel MOS transistor of the first differential transistor pair may be connected to the second input terminal. A first current mirror circuit comprises a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair. The second p-channel MOS transistor has a source connected to the high voltage line, a drain connected to the second differential amplifier circuit and a gate connected to the gate of the first n-channel MOS transistor of the first differential transistor pair. A second current mirror circuit comprises a pair of third and fourth p-channel MOS transistors. The third p-channel MOS transistor has a source connected to the high voltage line, a drain connected to a drain of the second n-channel MOS transistor of the first differential transistor pair, and a gate connected to the drain of the second n-channel MOS transistor of the first differential transistor pair. The fourth p-channel MOS transistor has a source connected to the high voltage line, a drain connected to the second differential amplifier circuit and also connected to the base of the n-p-n bipolar transistor as the second transistor of the intermediate circuitry, and a gate connected to the gate of the second n-channel MOS transistor of the first differential transistor pair. The second differential amplifier circuit comprises a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair- The second n-channel MOS transistor has a source connected to the low voltage line, a drain connected to a drain of the second p-channel MOS transistor of the second differential transistor pair and also connected to the base of the n-p-n bipolar transistor as the second transistor of the intermediate circuitry, and a gate connected to the gate of the first p-channel MOS transistor of the second differential transistor pair.

The first differential amplifier circuit comprises a first differential transistor pair of first and second n-p-n bipolar transistors connected to each other via emitters thereof which are connected via a constant current source to the low voltage line. A base of the first n-p-n bipolar transistor of the first differential transistor pair may be connected to the first input terminal. A base of the second n-p-n bipolar transistor of the first differential transistor pair may be connected to the second input terminal. A first current mirror circuit comprises a pair of first and second p-channel MOS transistors. The first p-channel MOS transistor has a source connected to the high voltage line, a drain connected to a collector of the first n-p-n bipolar transistor of the first differential transistor pair, and a gate connected to the collector of the first n-p-n bipolar transistor of the first differential transistor pair, and the second p-channel MOS transistor having a source connected to the high voltage line, a drain connected to the second differential amplifier circuit, and a gate connected to the collector of the first n-p-n bipolar transistor of the first differential transistor pair. A second current mirror circuit comprises a pair of third and fourth p-channel MOS transistors. The third p-channel MOS transistor has a source connected to the high voltage line, a drain connected to a collector of the second n-p-n bipolar transistor of the first differential transistor pair, and a gate connected to the collector of the second n-p-n bipolar transistor of the first differential transistor pair. The fourth p-channel MOS transistor has a source connected to the high voltage line. A drain connected to the second differential amplifier circuit and also connected to the base of the n-p-n bipolar transistor as the second transistor of the intermediate circuitry, and a gate connected to the collector of the second n-p-n bipolar transistor of the first differential transistor pair. The second differential amplifier circuit comprises a second differential transistor pair of first and second p-n-p bipolar transistors connected to each other via emitters thereof which are connected via a constant current source to the high voltage line. A base of the first p-n-p bipolar transistor of the second differential transistor pair may be connected to the second input terminal. A gate of the second p-n-p bipolar transistor of the second differential transistor pair may be connected to the first input terminal. A third current mirror circuit comprises a pair of first and second n-channel MOS transistors. The first n-channel MOS transistor has a source connected to the low voltage line, a drain connected to a collector of the first p-n-p bipolar transistor of the second differential transistor pair, a gate connected to the collector of the first p-n-p bipolar transistor of the second differential transistor pair, and the second n-channel MOS transistor has a source connected to the low voltage line, a drain connected to a collector of the second p-n-p bipolar transistor of the second differential transistor pair and also connected to the base of the n-p-n bipolar transistor as the second transistor of the intermediate circuitry, and a gate connected to the collector of the first p-n-p bipolar transistor of the second differential transistor pair, The first transistor comprises an p-channel MOS transistor having a source connected to the high voltage line, and a drain connected to the first constant current source and also connected to a gate of the p-channel MOS transistor in the output stage. The first constant current source may be connected to the low voltage line. The second transistor comprises an n-p-n bipolar transistor having an emitter connected to the low voltage line, a collector connected to the second constant current source and also connected to a gate of the p-channel MOS transistor as the first transistor and a base connected to the input stage and also connected to a base of the n-p-n bipolar transistor in the output stage. The second constant current source may be connected to the high voltage line.

The input stage may comprise a first input terminal for receiving first input signals, a second input terminal for receiving second input signals, a first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the n-p-n bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the n-p-n bipolar transistor in the output stage.

The first differential amplifier circuit comprises a first differential transistor pair of first and second n-channel MOS transistors connected to each other via sources thereof which are connected via a constant current source to the low voltage line. A gate of the first n-channel MOS transistor of the first differential transistor pair may be connected to the first input terminal. A gate of the second n-channel MOS transistor of the first differential transistor pair may be connected to the second input terminal. A first current mirror circuit comprises a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair, and the second p-channel MOS transistor having a source connected to the high voltage line, a drain connected to the second differential amplifier circuit, and a gate connected to the gate of the first n-channel MOS transistor of the first differential transistor pair. A second current mirror circuit comprises a pair of third and fourth p-channel MOS transistors. The third p-channel MOS transistor has a source connected to the high voltage line, a drain connected to a drain of the second n-channel MOS transistor of the first differential transistor pair, and a gate connected to the drain of the second n-channel MOS transistor of the first differential transistor pair, and the fourth p-channel MOS transistor has a source connected to the high voltage line, a drain connected to the second differential amplifier circuit and also connected to the base of the n-p-n bipolar transistor as the second transistor of the intermediate circuitry, and a gate connected to the gate of the second n-channel MOS transistor of the first differential transistor pair. The second differential amplifier circuit comprises a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair, and the second n-channel MOS transistor has a source connected to the low voltage line, a drain connected to a drain of the second p-channel MOS transistor of the second differential transistor pair and also connected to the base of the n-p-n bipolar transistor as the second transistor of the intermediate circuitry, and a gate connected to the gate of the first p-channel MOS transistor of the second differential transistor pair.

The first differential amplifier circuit comprises a first differential transistor pair of first and second n-p-n bipolar transistors connected to each other via emitters thereof which are connected via a constant current source to the low voltage line, a base of the first n-p-n bipolar transistor of the first differential transistor pair may be connected to the first input terminal, a base of the second n-p-n bipolar transistor of the first differential transistor pair may be connected to the second input terminal. A first current mirror circuit comprises a pair of first and second p-channel MOS transistors. The first p-channel MOS transistor has a source connected to the high voltage line, a drain connected to a collector of the first n-p-n bipolar transistor of the first differential transistor pair, and a gate connected to the collector of the first n-p-n bipolar transistor of the first differential transistor pair, and the second p-channel MOS transistor having a source connected to the high voltage line, a drain connected to the second differential amplifier circuit, and a gate connected to the collector of the first n-p-n bipolar transistor of the first differential transistor pair. A second current mirror circuit comprises a pair of third and fourth p-channel MOS transistors. The third p-channel MOS transistor has a source connected to the high voltage line, a drain connected to a collector of the second n-p-n bipolar transistor of the first differential transistor pair, and a gate connected to the collector of the second n-p-n bipolar transistor of the first differential transistor pair. The fourth p-channel MOS transistor has a source connected to the high voltage line, a drain connected to the second differential amplifier circuit and also connected to the base of the n-p-n bipolar transistor as the second transistor of the intermediate circuitry, and a gate connected to the collector of the second n-p-n bipolar transistor of the first differential transistor pair. The second differential amplifier circuit may comprise a second differential transistor pair of first and second p-n-p bipolar transistors connected to each other via emitters thereof which are connected via a constant current source to the high voltage line. A base of the first p-n-p bipolar transistor of the second differential transistor pair may be connected to the second input terminal. A gate of the second p-n-p bipolar transistor of the second differential transistor pair may be connected to the first input terminal. A third current mirror circuit comprises a pair of first and second n-channel MOS transistors. The first n-channel MOS transistor has a source connected to the low voltage line, a drain connected to a collector of the first p-n-p bipolar transistor of the second differential transistor pair, a gate connected to the collector of the first p-n-p bipolar transistor of the second differential transistor pair. The second n-channel MOS transistor has a source connected to the low voltage line, a drain connected to a collector of the second p-n-p bipolar transistor of the second differential transistor pair and also connected to the base of the n-p-n bipolar transistor as the second transistor of the intermediate circuitry, and a gate connected to the collector of the first p-n-p bipolar transistor of the second differential transistor pair.

Alternatively, the output stage may comprise an n-channel MOS transistor and a p-n-p bipolar transistor, both of which are connected in series to each other between the high voltage line and the low voltage line. The n-channel MOS transistor may be connected to the low voltage line and the p-n-p bipolar transistor may be connected to the high voltage line.

In the above case, the first transistor may comprise a p-channel MOS transistor having a source connected to the high voltage line, and a drain connected to the first constant current source and also connected to a gate of the n-channel MOS transistor in the output stage. The first constant current source may be connected to the low voltage line. The second transistor comprises a p-n-p bipolar transistor having an emitter connected to the high voltage line, a drain connected to the second constant current source and also connected to a gate of the p-channel MOS transistor as the first transistor and a base connected to the input stage and also connected to a base of the p-n-p bipolar transistor in the output stage. The second constant current source may be connected to the low voltage line.

In the above case, the input stage may comprise a first input terminal for receiving first input signals, a second input terminal for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the p-n-p bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the p-n-p bipolar transistor in the output stage.

The first differential amplifier circuit may comprise a first differential transistor pair of first and second p-channel MOS transistors connected to each other via sources thereof which are connected via a constant current source to the high voltage line. A gate of the first p-channel MOS transistor of the first differential transistor pair may be connected to the first input terminal, a gate of the second p-channel MOS transistor of the first differential transistor pair may be connected to the second input terminal. A first current mirror circuit comprises a pair of first and second n-channel MOS transistors. The first n-channel MOS transistor has a source connected to the low voltage line, a drain connected to a drain of the first p-channel MOS transistor of the first differential transistor pair, and a gate connected to the drain of the first p-channel MOS transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth p-channel MOS transistors. The third n-channel MOS transistor has a source connected to the low voltage line, a drain connected to a drain of the second p-channel MOS transistor of the first differential transistor pair, and a gate connected to the drain of the second p-channel MOS Transistor of the first differential transistor pair. The fourth n-channel MOS transistor has a source connected to the low voltage line, a drain connected to the second differential amplifier circuit and also connected to the base of the p-n-p bipolar transistor as the second transistor of the intermediate circuitry, and a gate connected to the gate of the second n-channel MOS transistor of the second current mirror circuit. The second differential amplifier circuit comprises a second differential transistor pair of first and second n-channel MOS transistors connected to each other via sources thereof which are connected via a constant current source to the low voltage line. A gate of the first n-channel MOS transistor of the second differential transistor pair may be connected to the second input terminal. A gate of the second n-channel MOS transistor of the second differential transistor pair may be connected to the first input terminal. A third current mirror circuit comprises a pair of first and second p-channel MOS transistors. The first p-channel MOS transistor has a source connected to the high voltage line, a drain connected to a drain of the first n-channel MOS transistor of the second differential transistor pair, a gate connected to the drain of the first n-channel MOS transistor of the second differential transistor pair. The second p-channel MOS transistor has a source connected to the high voltage line, a drain connected to a drain of the second n-channel MOS transistor of the second differential transistor pair and also connected to the base of the p-n-p bipolar transistor as the second transistor of the intermediate circuitry, and a gate connected to the gate of the first n-channel MOS transistor of the second differential transistor pair.

Alternatively, the first differential amplifier circuit comprises a first differential transistor pair of first and second p-n-p bipolar transistors connected to each other via emitters thereof which are connected via a constant current source to the high voltage line. A base of the first n-p-n bipolar transistor of the first differential transistor pair may be connected to the first input terminal. A base of the second n-p-n bipolar transistor of the first differential transistor pair may be connected to the second input terminal. A first current mirror circuit comprises a pair of first and second n-channel MOS transistors. The first n-channel MOS transistor has a source connected to the low voltage line, a drain connected to a collector of the first p-n-p bipolar transistor of the first differential transistor pair, and a gate connected to the collector of the first p-n-p bipolar transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth n-channel MOS transistors. The third n-channel MOS transistor has a source connected to the low voltage line, a drain connected to a collector of the second p-n-p bipolar transistor of the first differential transistor pair, and a gate connected to the collector of the second p-n-p bipolar transistor of the first differential transistor pair. The fourth n-channel MOS transistor has a source connected to the low voltage line, a drain connected to the second differential amplifier circuit and also connected to the base of the p-n-p bipolar transistor as the second transistor of the intermediate circuitry, and a gate connected to the gate of the first n-channel MOS transistor of the second current mirror circuit. The second differential amplifier circuit comprises a second differential transistor pair of first and second n-p-n bipolar transistors connected to each other via emitters thereof which are connected via a constant current source to the low voltage line. A base of the first n-p-n bipolar transistor of the second differential transistor pair may be connected to the second input terminal. A base of the second n-p-n bipolar transistor of the second differential transistor pair may be connected to the first input terminal. A third current mirror circuit comprises a pair of first and second p-channel MOS transistors. The first p-channel MOS transistor has a source connected to the high voltage line, a drain connected to a collector of the first n-p-n bipolar transistor of the second differential transistor pair, a gate connected to the collector of the first n-p-n bipolar transistor of the second differential transistor pair. The second p-channel MOS transistor has a source connected to the high voltage line, a drain connected to a collector of the second n-p-n bipolar transistor of the second differential transistor pair and also connected to the base of the p-n-p bipolar transistor as the second transistor of the intermediate circuitry, and a gate connected to the gate of the first p-channel MOS transistor of the third current mirror circuit.

The first transistor comprises an n-channel MOS transistor having a source connected to the low voltage line, and a drain connected to the first constant current source and also connected to a gate of the n-channel MOS transistor in the output stage. The first constant current source may be connected to the high voltage line. The second transistor comprises a p-n-p bipolar transistor having an emitter connected to the high voltage line, a collector connected to the second constant current source and also connected to a gate of the n-channel MOS transistor as the first transistor and a base connected to the input stage and also connected to a base of the p-n-p bipolar transistor in the output stage. The second constant current source may be connected to the low voltage line.

In the above case, the input stage may comprise the following. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the base of the second transistor of the intermediate circuitry and also connected to the p-n-p bipolar transistor in the output stage. A second differential amplifier circuit may be connected to the first input terminal and the second input terminal. The second differential amplifier circuit may be biased between the high voltage line and the low voltage line. An output of the second differential amplifier may be connected to the base of the second transistor of the intermediate circuitry and also connected to the p-n-p bipolar transistor in the output stage.

The first differential amplifier circuit comprises a first differential transistor pair of first and second p-channel MOS transistors connected to each other via sources thereof which are connected via a constant current source to the high voltage line. A gate of the first p-channel MOS transistor of the first differential transistor pair may be connected to the first input terminal. A gate of the second p-channel MOS transistor of the first differential transistor pair may be connected to the second input terminal. A first current mirror circuit comprises a pair of first and second n-channel MOS transistors. The first n-channel MOS transistor has a source connected to the low voltage line, a drain connected to a drain of the first p-channel MOS transistor of the first differential transistor pair, and a gate connected to the drain of the first p-channel MOS transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth p-channel MOS transistors. The third n-channel MOS transistor has a source connected to the low voltage line, a drain connected to a drain of the second p-channel MOS transistor of the first differential transistor pair, and a gate connected to the drain of the second p-channel MOS transistor of the first differential transistor pair. The fourth n-channel MOS transistor has a source connected to the low voltage line, a drain connected to the second differential amplifier circuit and also connected to the base of the p-n-p bipolar transistor as the second transistor of the intermediate circuitry, and a gate connected to the gate of the second n-channel MOS transistor of the second current mirror circuit. The second differential amplifier circuit comprises a second differential transistor pair of first and second n-channel MOS transistors connected to each other via sources thereof which are connected via a constant current source to the low voltage line. A gate of the first n-channel MOS transistor of the second differential transistor pair may be connected to the second input terminal. A gate of the second n-channel MOS transistor of the second differential transistor pair may be connected to the first input terminal. A third current mirror circuit comprises a pair of first and second p-channel MOS transistors. The first p-channel MOS transistor has a source connected to the high voltage line, a drain connected to a drain of the first n-channel MOS transistor of the second differential transistor pair, a gate connected to the drain of the first n-channel MOS transistor of the second differential transistor pair, and the second p-channel MOS transistor having a source connected to the high voltage line, a drain connected to a drain of the second n-channel MOS transistor of the second differential transistor pair and also connected to the base of the p-n-p bipolar transistor as the second transistor of the intermediate circuitry, and a gate connected to the gate of the first n-channel MOS transistor of the second differential transistor pair.

The first differential amplifier circuit may comprise a first differential transistor pair of first and second p-n-p bipolar transistors connected to each other via emitters thereof which are connected via a constant current source to the high voltage line, a base of the first n-p-n bipolar transistor of the first differential transistor pair may be connected to the first input terminal, a base of the second n-p-n bipolar transistor of the first differential transistor pair may be connected to the second input terminal. A first current mirror circuit comprises a pair of first and second n-channel MOS transistors. The first n-channel MOS transistor has a source connected to the low voltage line, a drain connected to a collector of the first p-n-p bipolar transistor of the first differential transistor pair, and a gate connected to the collector of the first p-n-p bipolar transistor of the first differential transistor pair. The second n-channel MOS transistor has a source connected to the low voltage line, a drain connected to the second differential amplifier circuit, and a gate connected to the gate of the first n-channel MOS transistor of the first current mirror circuit. A second current mirror circuit comprises a pair of third and fourth n-channel MOS transistors. The third n-channel MOS transistor has a source connected to the low voltage line, a drain connected to a collector of the second p-n-p bipolar transistor of the first differential transistor pair, and a gate connected to the collector of the second p-n-p bipolar transistor of the first differential transistor pair, and the fourth n-channel MOS transistor having a source connected to the low voltage line, a drain connected to the second differential amplifier circuit and also connected to the base of the p-n-p bipolar transistor as the second transistor of the intermediate circuitry, and a gate connected to the gate of the first n-channel MOS transistor of the second current mirror circuit. The second differential amplifier circuit comprises a second differential transistor pair of first and second n-p-n bipolar transistors connected to each other via emitters thereof which are connected via a constant current source to the low voltage line, a base of the first n-p-n bipolar transistor of the second differential transistor pair may be connected to the second input terminal, a base of the second n-p-n bipolar transistor of the second differential transistor pair may be connected to the first input terminal. A third current mirror circuit comprises a pair of first and second p-channel MOS transistors. The first p-channel MOS transistor has a source connected to the high voltage line, a drain connected to a collector of the first n-p-n bipolar transistor of the second differential transistor pair, a gate connected to the collector of the first n-p-n bipolar transistor of the second differential transistor pair. The second p-channel MOS transistor has a source connected to the high voltage line, a drain connected to a collector of the second n-p-n bipolar transistor of the second differential transistor pair and also connected to the base of the p-n-p bipolar transistor as the second transistor of the intermediate circuitry, and a gate connected to the gate of the first p-channel MOS transistor of the third current mirror circuit.

In the above case, the output stage comprises a complementary MOS circuit having an p-channel MOS transistor and a n-channel MOS transistor, both of which are connected in series to each other between the high voltage line and the low voltage line. The p-channel MOS transistor may be connected to the high voltage line. The n-channel MOS transistor may be connected to the low voltage line. The input stage includes at least a differential amplifier circuit. The first transistor comprises a n-channel MOS transistor having a source connected to the low voltage line, and a drain connected to the first constant current source and also connected to a gate of the p-channel MOS transistor in the output stage. The first constant current source may be connected to the high voltage line. The second transistor comprises an n-channel MOS transistor having a source connected to the low voltage line, a drain connected to the second constant current source and also connected to a gate of the n-channel MOS transistor as the first transistor and a gate connected to the input stage and also connected to a gate of the n-channel MOS transistor in the output stage. The second constant current source may be connected to the high voltage line. The intermediate circuitry further comprises a first additional n-channel MOS transistor having a source connected to the source of the n-channel MOS transistor as the second transistor, a drain connected to the drain of the n-channel MOS transistor as the second transistor, and a gate connected to the gate of the n-channel MOS transistor as the first transistor and also connected to the drain of the n-channel MOS transistor as the second transistor.

In the above, the input stage may comprise as follows. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

The operational amplifier may further comprise a first additional p-channel MOS transistor having a source connected to the first constant current source, a drain connected to the drain of the n-channel MOS transistor as the first transistor, and a gate connected to the gate of the p-channel MOS transistor in the output stage.

The operational amplifier may further comprise a second additional n-channel MOS transistor having a source connected to the source of the n-channel MOS transistor as the first transistor, a drain connected to the drain of the n-channel MOS transistor as the first transistor, and a gate connected to the drain of the n-channel MOS transistor as the first transistor.

The first differential amplifier circuit may comprise a first differential transistor pair of first and second n-channel MOS transistors connected to each other via sources thereof which are connected via a constant current source to the low voltage line. A gate of the first n-channel MOS transistor of the first differential transistor pair may be connected to the first input terminal, a gate of the second n-channel MOS transistor of the first differential transistor pair may be connected to the second input terminal. A first current mirror circuit comprises a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair, and the second p-channel MOS transistor has a source connected to the high voltage line, a drain connected to the second differential amplifier circuit, and a gate connected to the gate of the first n-channel MOS transistor of the first differential transistor pair. A second current mirror circuit comprises a pair of third and fourth p-channel MOS transistors. The third p-channel MOS transistor has a source connected to the high voltage line, a drain connected to a drain of the second n-channel MOS transistor of the first differential transistor pair, and a gate connected to the drain of the second n-channel MOS transistor of the first differential transistor pair. The fourth p-channel MOS transistor has a source connected to the high voltage line, a drain connected to the second differential amplifier circuit and also connected to the gate of the n-channel MOS transistor as the second transistor of the intermediate circuitry, and a gate connected to the gate of the second n-channel MOS transistor of the first differential transistor pair. The second differential amplifier circuit may comprise a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair. The second n-channel MOS transistor has a source connected to the low voltage line, a drain connected to a drain of the second p-channel MOS transistor of the second differential transistor pair and also connected to the gate of the n-channel MOS transistor as the second transistor of the intermediate circuitry, and a gate connected to the gate of the first p-channel MOS transistor of the second differential transistor pair.

In the above case, the output stage may comprise a complementary MOS circuit having an p-channel MOS transistor and a n-channel MOS transistor, both of which are connected in series to each other between the high voltage line and the low voltage line. The p-channel MOS transistor may be connected to the high voltage line. The n-channel MOS transistor may be connected to the low voltage line.

It is essential that the input stage includes at least a differential amplifier circuit.

The first transistor comprises an p-channel MOS transistor having a source connected to the high voltage line, and a drain connected to the first constant current source and also connected to a gate of the p-channel MOS transistor in the output stage. The first constant current source may be connected to the low voltage line. The second transistor comprises a n-channel MOS transistor having a source connected to the low voltage line, a drain connected to the second constant current source and also connected to a gate of the p-channel MOS transistor as the first transistor and a gate connected to the input stage and also connected to a gate of the n-channel MOS transistor in the output stage. The second constant current source may be connected to the high voltage line. The intermediate circuitry may further comprise a first additional p-channel MOS transistor having a source connected to the source of the p-channel MOS transistor as the first transistor, a drain connected to the drain of the p-channel MOS transistor as the first transistor, and a gate connected to the gate of the p-channel MOS transistor in the output stage and also connected to the drain of the p-channel MOS transistor as the first transistor.

In the above case, the input stage may comprise as follows. A first input terminal is provided for receiving first input signals. A second input terminal is provided for receiving second input signals. A first differential amplifier circuit may be connected to the first input terminal and the second input terminal. The first differential amplifier circuit may be biased between the high voltage line and the low voltage line. An output of the first differential amplifier may be connected to the gate of the second transistor of the intermediate circuitry and also connected to the n-channel MOS transistor in the output stage. A second differential amplifier circuit may be connected to the first input terminal and the second input terminal. The second differential amplifier circuit may be biased between the high voltage line and the low voltage line. An output of the second differential amplifier may be connected to the gate of the second transistor of the intermediate circuitry and also connected to the n-channel MOS transistor in the output stage.

The first differential amplifier circuit comprises a first differential transistor pair of first and second n-channel MOS transistors connected to each other via sources thereof which are connected via a constant current source to the low voltage line, a gate of the first n-channel MOS transistor of the first differential transistor pair may be connected to the first input terminal, a gate of the second n-channel MOS transistor of the first differential transistor pair may be connected to the second input terminal. A first current mirror circuit comprises a pair of first and second p-channel MOS transistors. The first p-channel MOS transistor has a source connected to the high voltage line, a drain connected to a drain of the first n-channel MOS transistor of the first differential transistor pair, and a gate connected to the drain of the first n-channel MOS transistor of the first differential transistor pair. The second p-channel MOS transistor has a source connected to the high voltage line, a drain connected to the second differential amplifier circuit, and a gate connected to the gate of the first n-channel MOS transistor of the first differential transistor pair. A second current mirror circuit comprises a pair of third and fourth p-channel MOS transistors. The third p-channel MOS transistor has a source connected to the high voltage line, a drain connected to a drain of the second n-channel MOS transistor of the first differential transistor pair, and a gate connected to the drain of the second n-channel MOS transistor of the first differential transistor pair. The fourth p-channel MOS transistor has a source connected to the high voltage line, a drain connected to the second differential amplifier circuit and also connected to the gate of the n-channel MOS transistor as the second transistor of the intermediate circuitry, and a gate connected to the gate of the second n-channel MOS transistor of the first differential transistor pair.

The second differential amplifier circuit comprises a second differential transistor pair of first and second p-channel MOS transistors connected to each other via sources thereof which are connected via a constant current source to the high voltage line. A gate of the first p-channel MOS transistor of the second differential transistor pair may be connected to the second input terminal. A gate of the second p-channel MOS transistor of the second differential transistor pair may be connected to the first input terminal. A third current mirror circuit comprises a pair of first and second n-channel MOS transistors. The first n-channel MOS transistor has a source connected to the low voltage line, a drain connected to a drain of the first p-channel MOS transistor of the second differential transistor pair, a gate connected to the drain of the first p-channel MOS transistor of the second differential transistor pair. The second n-channel MOS transistor has a source connected to the low voltage line, a drain connected to a drain of the second p-channel MOS transistor of the second differential transistor pair and also connected to the gate of the n-channel MOS transistor as the second transistor of the intermediate circuitry, and a gate connected to the gate of the first p-channel MOS transistor of the second differential transistor pair.

PREFERRED EMBODIMENTS

FIRST EMBODIMENT

A first embodiment according to the present invention will be described in detail with reference to the accompanying drawings.

FIG. 1 is a circuit diagram illustrative of an improved operational amplifier in a first embodiment according to the present invention.

An operational amplifier comprises an input stage, an output stage, and an intermediate circuitry connected between the input stage and the output stage. The operational amplifier may be biased between a high voltage line 5 and a low voltage line 4. The input stage includes at least an amplifier circuit. The intermediate circuitry comprises at least a first pair of a first transistor M12 and a first constant current source I4, both of which are connected in series to each other between the high voltage line 5 and the low voltage line 4. The first pair may be adjacent to the output stage. A first intermediate point between the first transistor M12 and the first constant current source I4 may be connected to the output stage. At least a second pair of a second transistor M11 and a second constant current source I3 are provided, both of which are connected in series to each other between the high voltage line 5 and the low voltage line 4. The second pair may be in parallel to the first pair and may be adjacent to the input stage. A second intermediate point between the second transistor M11 and the second constant current source I3 may be connected to a control electrode of the first transistor M12. A control gate of the second transistor M11 may be connected to the input stage.

The output stage may comprise a complementary MOS circuit having a p-channel MOS transistor M13 and an n-channel MOS transistor M14, both of which are connected in series to each other between the high voltage line 5 and the low voltage line 4. The p-channel MOS transistor M13 may be connected to the high voltage line 5, and the n-channel MOS transistor M14 may be connected to the low voltage line 4.

The first transistor M12 may comprise an n-channel MOS transistor having a source connected to the low voltage line 4, and a drain connected to the first constant current source I4 and also connected to a gate of the p-channel MOS transistor M13 in the output stage. The first constant current source I4 may be connected to the high voltage line. The second transistor M11 may comprise a n-channel MOS transistor having a source connected to the low voltage line 4, a drain connected to the second constant current source I3 and also connected to a gate of the n-channel MOS transistor as the first transistor M12 and a gate connected to the input stage and also connected to a gate of the n-channel MOS transistor M14 in the output stage. The second constant current source I3 may be connected to the high voltage line 5.

The input stage may comprise the following. A first input terminal 1 is provided for receiving first input signals. A second input terminal 2 is provided for receiving second input signals. A first differential amplifier circuit may be connected to the first input terminal 1 and the second input terminal 2. The first differential amplifier circuit may be biased between the high voltage line 5 and the low voltage line 4. An output of the first differential amplifier may be connected to the gate of the second transistor M11 of the intermediate circuitry and also connected to the n-channel MOS transistor M14 in the output stage. A second differential amplifier circuit may be connected to the first input terminal 1 and the second input terminal 2. The second differential amplifier circuit may be biased between the high voltage line 5 and the low voltage line 4. An output of the second differential amplifier may be connected to the gate of the second transistor M11 of the intermediate circuitry and also connected to the n-channel MOS transistor M14 in the output stage.

The first differential amplifier circuit may comprise the following. A first differential transistor pair of first and second n-channel MOS transistors M1 and M2 connected to each other via sources thereof which may be connected via a constant current source I1 to the low voltage line 4. A gate of the first n-channel MOS transistor M1 of the first differential transistor pair may be connected to the first input terminal 1. A gate of the second n-channel MOS transistor M2 of the first differential transistor pair may be connected to the second input terminal 2. A first current mirror circuit may comprise a pair of first and second p-channel MOS transistors M3 and M9. The first p-channel MOS transistor M3 has a source connected to the high voltage line 5, a drain connected to a drain of the first n-channel MOS transistor M1 of the first differential transistor pair, and a gate connected to the drain of the first n-channel MOS transistor M1 of the first differential transistor pair. The second p-channel MOS transistor M9 has a source connected to the high voltage line 5, a drain connected to the second differential amplifier circuit, and a gate connected to the gate of the first n-channel MOS transistor M1 of the first differential transistor pair. A second current mirror circuit may comprise a pair of third and fourth p-channel MOS transistors M4 and M10. The third p-channel MOS transistor M4 may have a source connected to the high voltage line 5, a drain connected to a drain of the second n-channel MOS transistor M2 of the first differential transistor pair, and a gate connected to the drain of the second n-channel MOS transistor M4 of the first differential transistor pair. The fourth p-channel MOS transistor M10 has a source connected to the high voltage line 5, a drain connected to the second differential amplifier circuit and also connected to the gate of the n-channel MOS transistor M11 as the second transistor of the intermediate circuitry, and a gate connected to the gate of the second n-channel MOS transistor M2 of the first differential transistor pair. The second differential amplifier circuit comprise a second differential transistor pair of first and second p-channel MOS transistors M6 and MS connected to each other via sources thereof which are connected via a constant current source I2 to the high voltage line 5. A gate of the first p-channel MOS transistor M6 of the second differential transistor pair may be connected to the second input terminal 2. A gate of the second p-channel MOS transistor MS of the second differential transistor pair may be connected to the first input terminal 1. A third current mirror circuit comprises a pair of first and second n-channel MOS transistors M7 and M8. The first n-channel MOS transistor M7 has a source connected to the low voltage line 4, a drain connected to a drain of the first p-channel MOS transistor M6 of the second differential transistor pair, a gate connected to the drain of the first p-channel MOS transistor M6 of the second differential transistor pair. The second n-channel MOS transistor M8 has a source connected to the low voltage line 4, a drain connected to a drain of the second p-channel MOS transistor MS of the second differential transistor pair and also connected to the gate of the n-channel MOS transistor as the second transistor M11 of the intermediate circuitry, and a gate connected to the gate of the first p-channel MOS transistor M6 of the second differential transistor pair.

The third current mirror circuit acts as an active load. The first and second differential amplifiers are connected in parallel to each other to obtain a wide input/output range.

In accordance with a ratio of voltage levels of first and second signals applied to the first and second input terminals, a gate voltage applied to the gate of the p-channel MOS transistor M14 on the output stage is varied. Signals through the p-channel MOS transistors M11 and M12 vary the gate voltage applied to the gate of the n-channel MOS transistor M13. In accordance with respective variations in gate voltage levels of the p-channel MOS transistor M14 and the n-channel MOS transistor M13, a potential of the output terminal 3 is rapidly raised and lowered.

If a voltage applied to the first input terminal 1 is higher than that applied to the second input terminal 2, a gate voltage applied to the gates of the p-channel MOS transistors M11 and M14 becomes low. Thus, a current having passed from the output terminal 3 through the p-channel MOS transistor 14 to the low voltage line 4 becomes extremely small. Simultaneously, the gate voltage of the p-channel MOS transistor M12 is raised. As a result, the gate voltage of the n-channel MOS transistor M13 is dropped. In this case, a large current flows from the high voltage line 5 through the n-channel MOS transistor M13 to the output terminal 3, whilst no current flows through the p-channel MOS transistor 14, whereby the potential of the output terminal 3 is rapidly increased.

On the other hand, if the input signal voltage applied to the first input terminal 1 is lower than that applied to the second input terminal 2, then the gate voltage of the p-channel MOS transistors M11 and M14 becomes high. Thus, a large current flows from the output terminal 3 through the p-channel MOS transistor M14 to the low voltage line 4. Simultaneously, the gate voltage of the p-channel MOS transistor M12 becomes low. As a result, the gate voltage of the n-channel MOS transistor M13 becomes high. No current flows from the high voltage line 5 through the n-channel MOS transistor M13 to the output terminal 3. As a result, a large current flows through the output terminal 3 through the p-channel MOS transistor M14 to the low voltage line 4, whereby the potential of the output terminal 3 is rapidly dropped.

The potential of the output terminal 3 may be varied in the range of from a potential lower than the high voltage line 5 by the source-drain voltage of the n-channel MOS transistor 13 to a potential higher than the low voltage line 4 by the source-drain voltage of the p-channel MOS transistor 14. This means wide range input/output are possible.

An idling current flowing through the n-channel MOS transistor M13 and the p-channel MOS transistor M14 in the equilibrium state is defined by both a size ratio of the p-channel MOS transistors M11 and M14 and the constant current source I3, for which reason no influence to the idling current due to variation in threshold voltage appears.

The above operational amplifier has wide input and output ranges and shows rapid increased and decrease of the potential of the output terminal. Further, the idling current is free from any influence of variations in absolute threshold values of the transistors. It is further possible to suppress any punch through current in response to the discharge current flowing in the discharge operation over the operational amplifier.

SECOND EMBODIMENT

A second embodiment according to the present invention will be described in detail with reference to the accompanying drawings.

Figure 2:
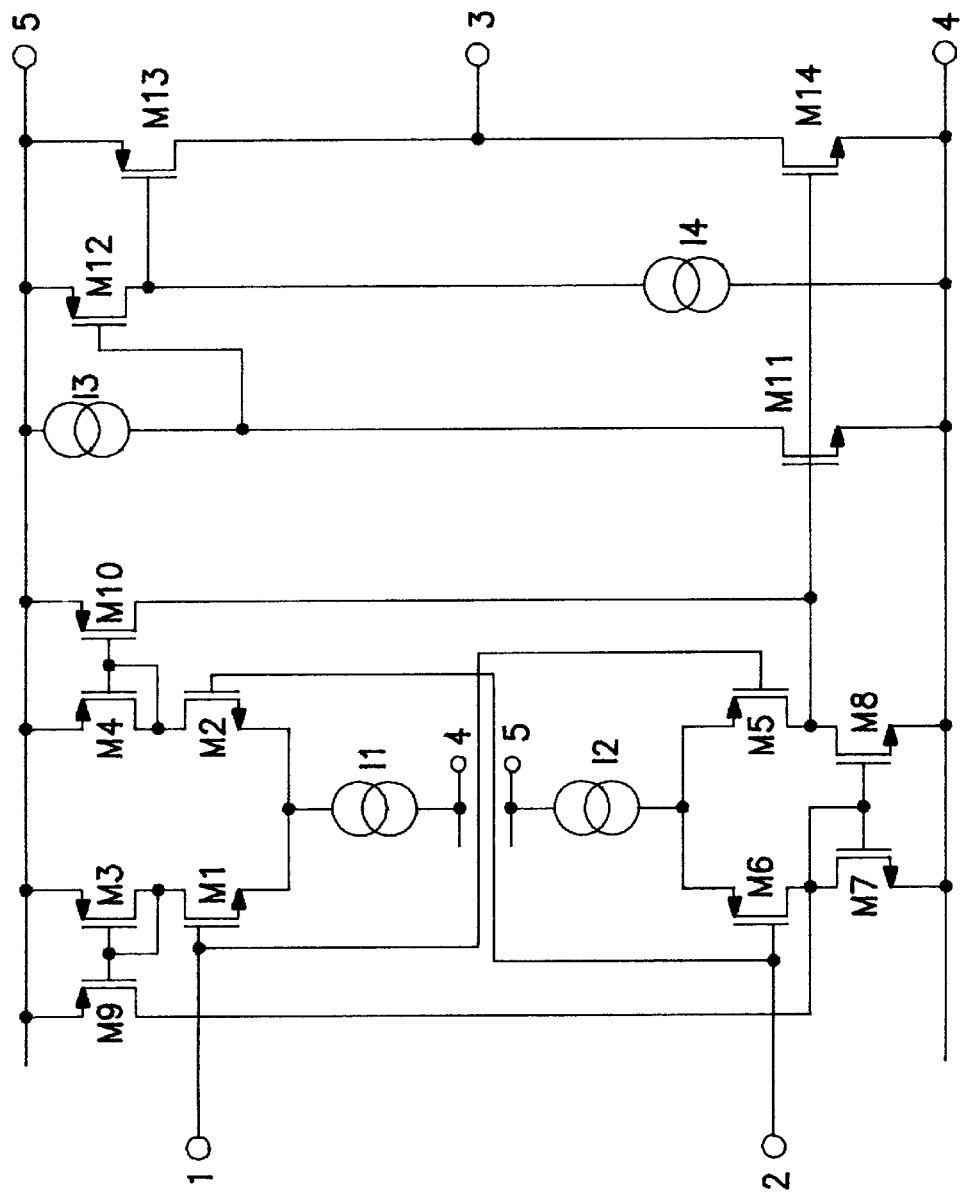
FIG. 2 is a circuit diagram illustrative of an improved operational amplifier in a second embodiment according to the present invention.

FIG. 2 is a circuit diagram illustrative of an improved operational amplifier in a second embodiment according to the present invention.

The operational amplifier provided in this embodiment differs in circuit configuration from that in the first embodiment as follows. The first transistor M12 in the intermediate circuitry comprises a p-channel MOS transistor and the first transistor M12 is provided between the first constant current source 14 and the high voltage line 5.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

THIRD EMBODIMENT

A third embodiment according to the present invention will be described in detail with reference to the accompanying drawings.

Figure 3:
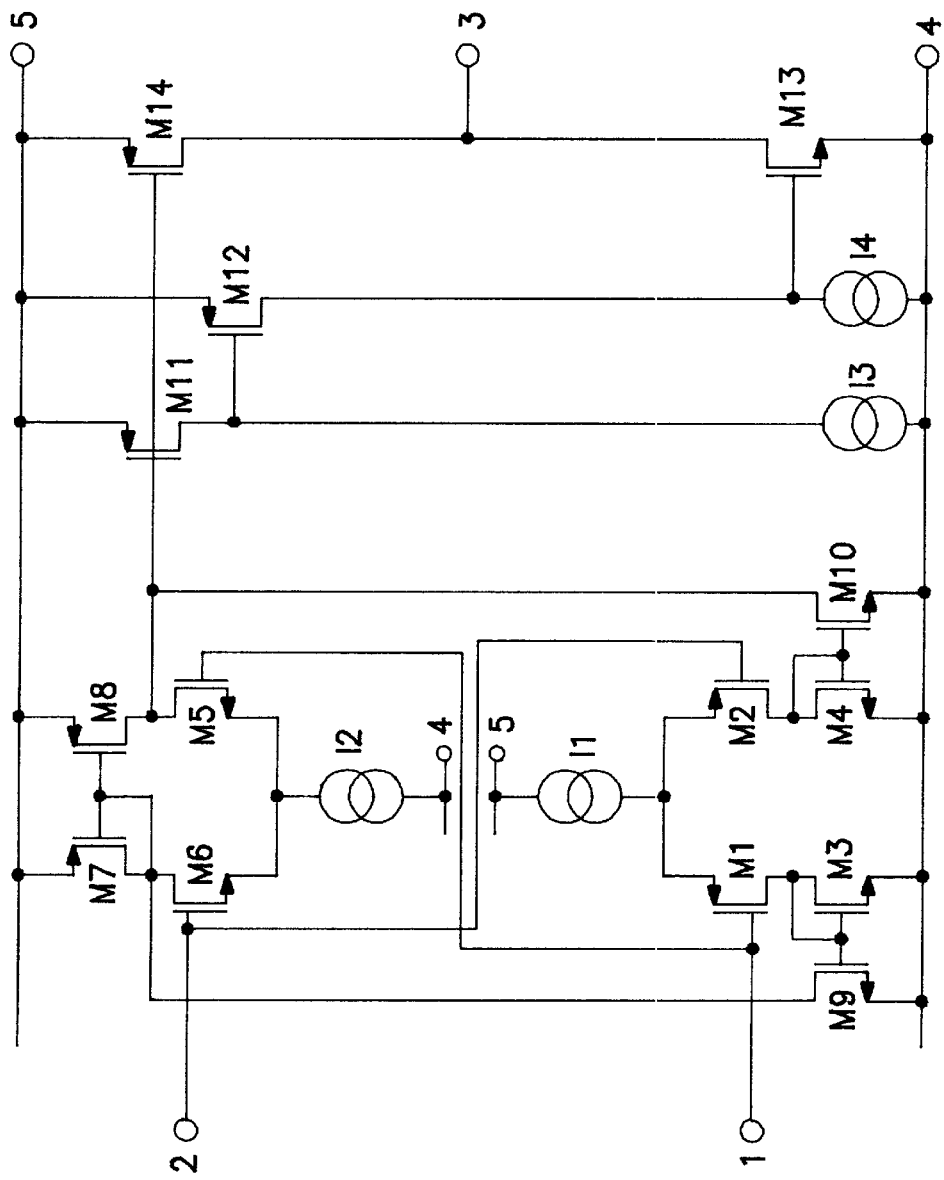
FIG. 3 is a circuit diagram illustrative of an improved operational amplifier in a third embodiment according to the present invention.

FIG. 3 is a circuit diagram illustrative of an improved operational amplifier in a third embodiment according to the present invention.

The operational amplifier provided in this embodiment differs in circuit configuration from that in the first embodiment as follows. The MOS transistors M1, M2, M7, M8, M11, M12, M14 comprise p-channel MOS transistors. The MOS transistors M3, M4, MS M6, M9, M10, M1 3 comprise n-channel MOS transistors. The constant current sources I1, I2, I3, I4 have opposite polarity to that in the first embodiment. The first and second p-channel MOS transistors M12 and M11 are provided between the high voltage line 5 and the first and second constant current sources I4 and I3. The constant current sources I1 and I1 are connected to the high voltage line 5 and the low voltage line 4. The polarity of the circuit is opposite to that in the first embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

FOURTH EMBODIMENT

A fourth embodiment according to the present invention will be described in detail with reference to the accompanying drawings.

Figure 4:
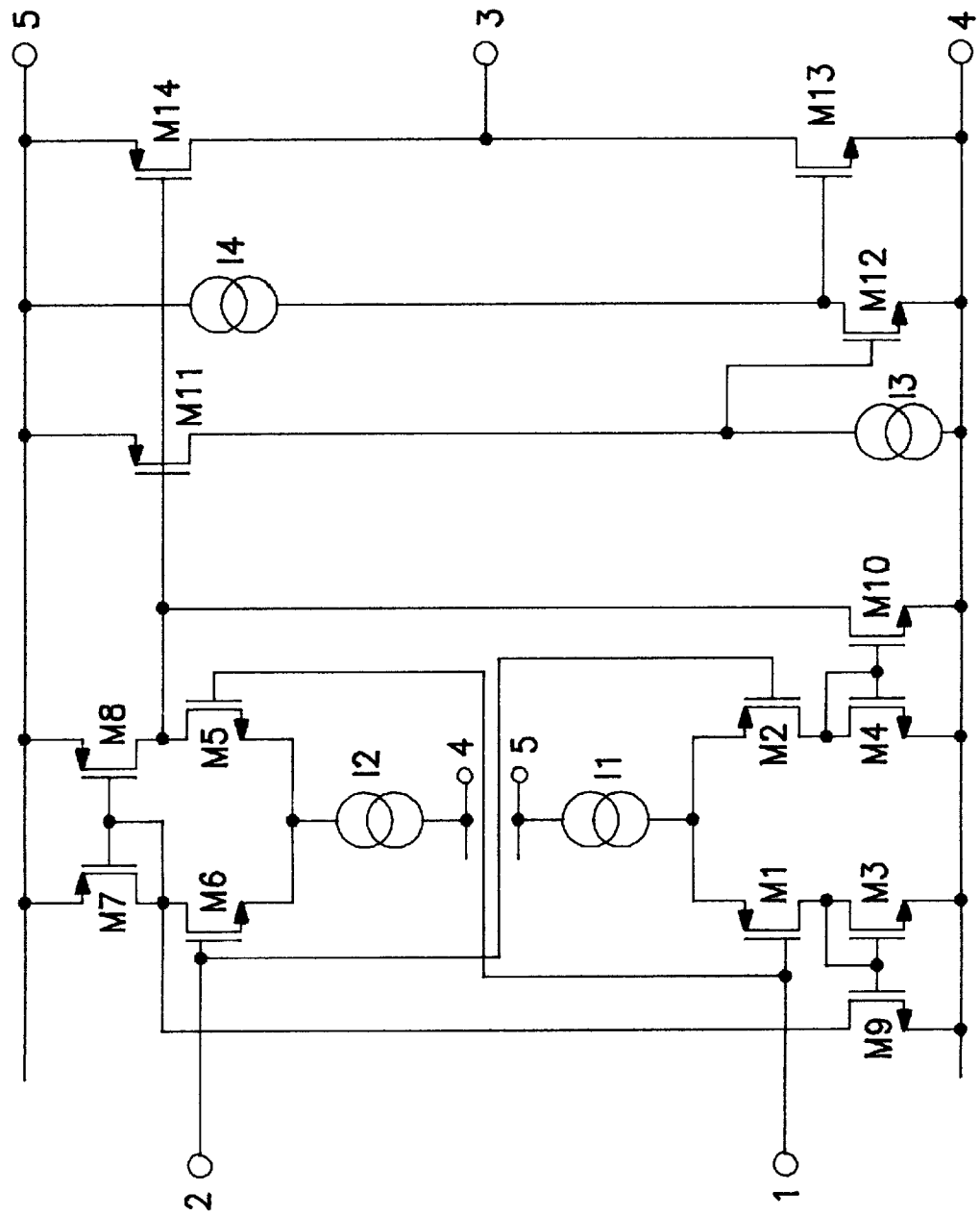
FIG. 4 is a circuit diagram illustrative of an improved operational amplifier in a fourth embodiment according to the present invention.

FIG. 4 is a circuit diagram illustrative of an improved operational amplifier in a fourth embodiment according to the present invention.

The operational amplifier provided in this embodiment differs in circuit configuration from that in the second embodiment as follows. The MOS transistors M1, M2, M7, M8, M11, M14 comprise p-channel MOS transistors. The MOS transistors M3, M4, M5 M6, M9, M10, M12, M13 comprise n-channel MOS transistors. The constant current sources I1, I2, I3, I4 have opposite polarity to that in the second embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

FIFTH EMBODIMENT

A fifth embodiment according to the present invention will be described in detail with reference to the accompanying drawings.

Figure 5:
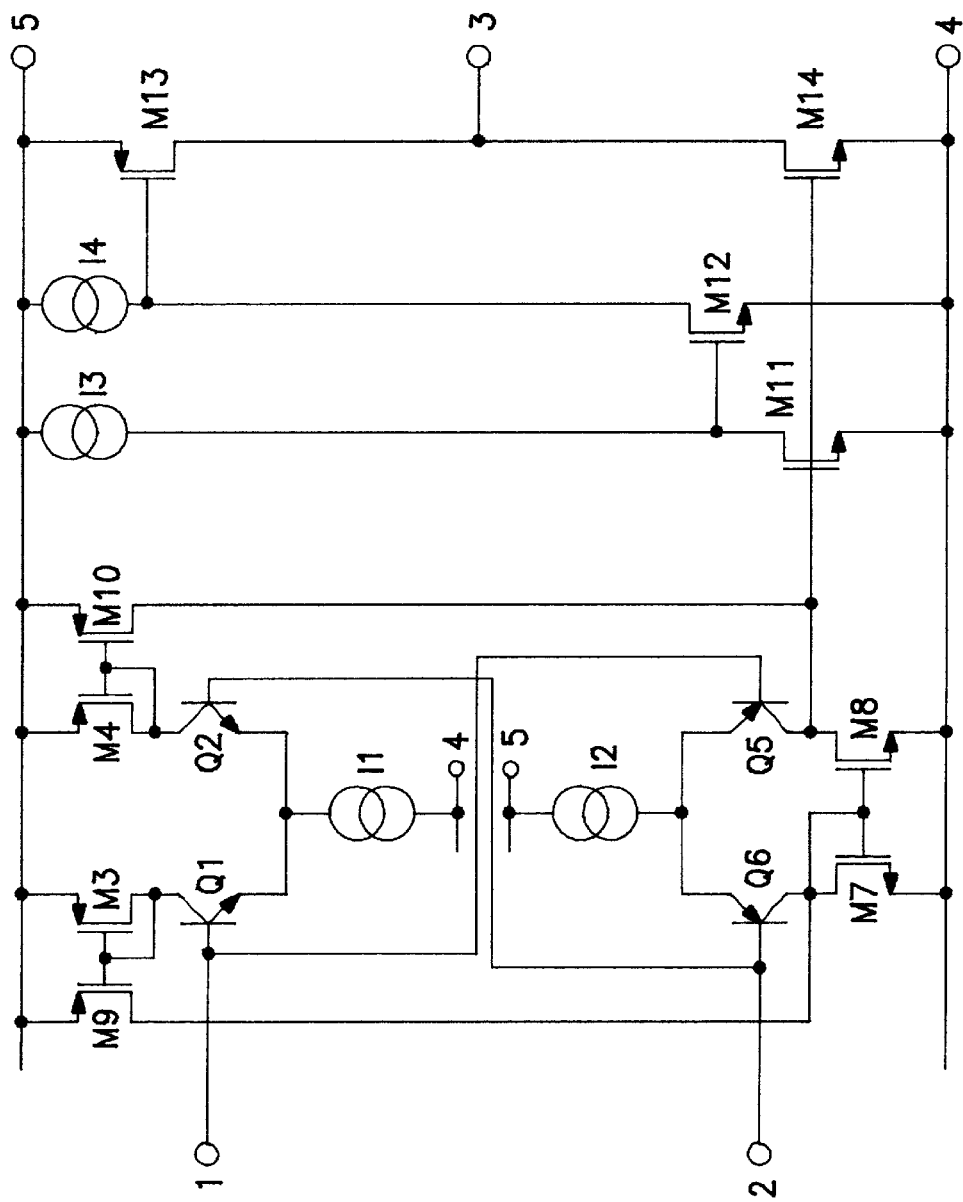
FIG. 5 is a circuit diagram illustrative of an improved operational amplifier in a fifth embodiment according to the present invention.

FIG. 5 is a circuit diagram illustrative of an improved operational amplifier in a fifth embodiment according to the present invention.

The operational amplifier provided in this embodiment differs in circuit configuration from that in the first embodiment as follows. In place of the MOS transistors M1 and M2, the n-p-n bipolar transistors Q1 and Q2 are provided. In place of the MOS transistors M5 and M6, the p-n-p bipolar transistors Q5 and Q6 are provided. The first transistor M12 in the intermediate circuitry comprises a p-channel MOS transistor and the first transistor M12 is provided between the first constant current source I4 and the high voltage line 5.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

SIXTH EMBODIMENT

A sixth embodiment according to the present invention will be described in detail with reference to the accompanying drawings.

Figure 6:
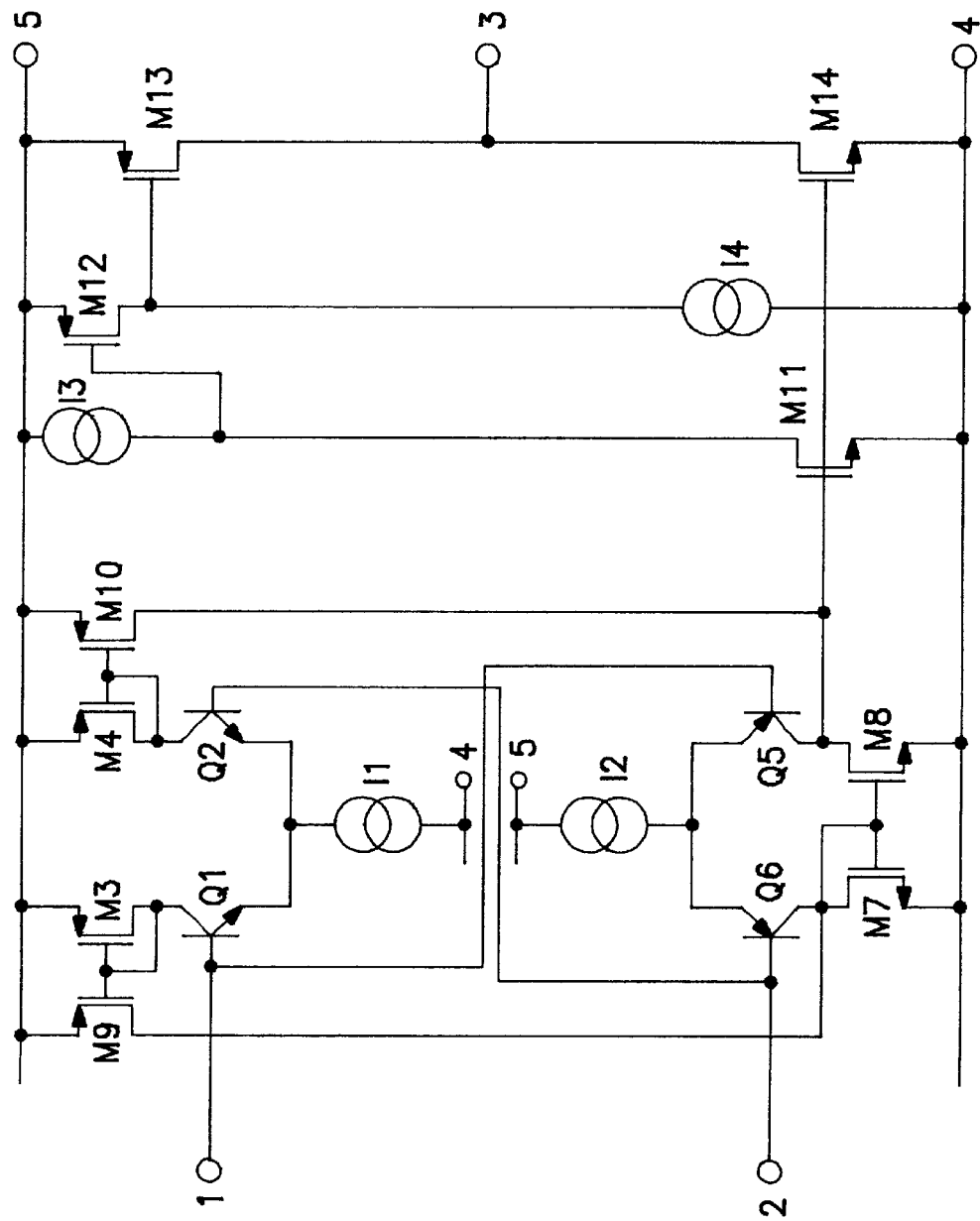
FIG. 6 is a circuit diagram illustrative of an improved operational amplifier in a sixth embodiment according to the present invention.

FIG. 6 is a circuit diagram illustrative of an improved operational amplifier in a sixth embodiment according to the present invention.

The operational amplifier provided in this embodiment differs in circuit configuration from that in the second embodiment as follows. In place of the MOS transistors M1 and M2, the n-p-n bipolar transistors Q1 and Q2 are provided. In place of the MOS transistors M5 and M6, the p-n-p bipolar transistors Q5 and Q6 are provided. The first transistor M12 in the intermediate circuitry comprises a p-channel MOS transistor and the first transistor M12 is provided between the first constant current source I4 and the high voltage line 5.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

SEVENTH EMBODIMENT

A seventh embodiment according to the present invention will be described in detail with reference to the accompanying drawings.

Figure 7:
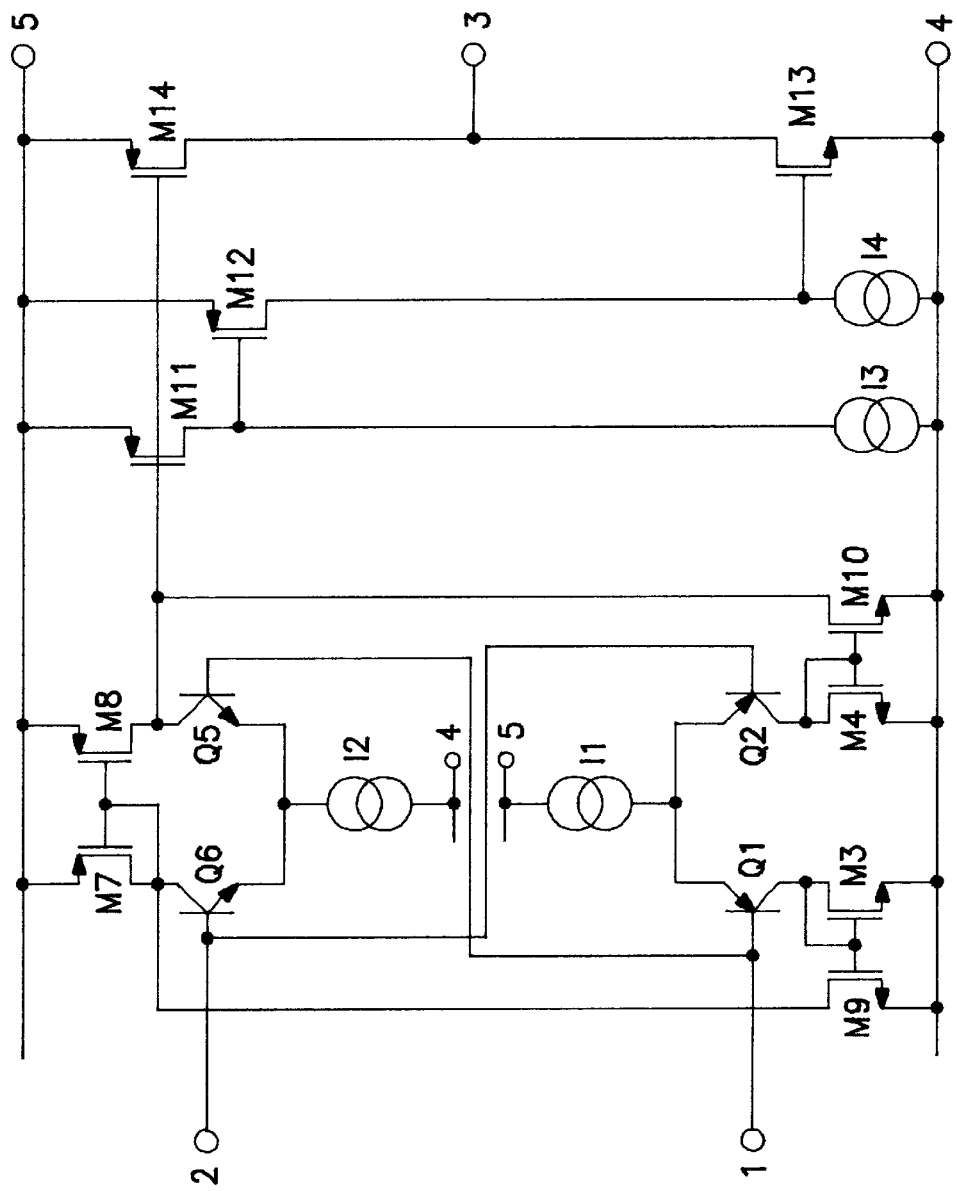
FIG. 7 is a circuit diagram illustrative of an improved operational amplifier in a seventh embodiment according to the present invention.

FIG. 7 is a circuit diagram illustrative of an improved operational amplifier in a seventh embodiment according to the present invention.

The operational amplifier provided in this embodiment differs from that in the fifth embodiment in opposite polarity of each elements on circuit configuration. The functions and effects of the operational amplifier are the same as in the fifth embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

EIGHTH EMBODIMENT

An eighth embodiment according to the present invention will be described in detail with reference to the accompanying drawings.

Figure 8:
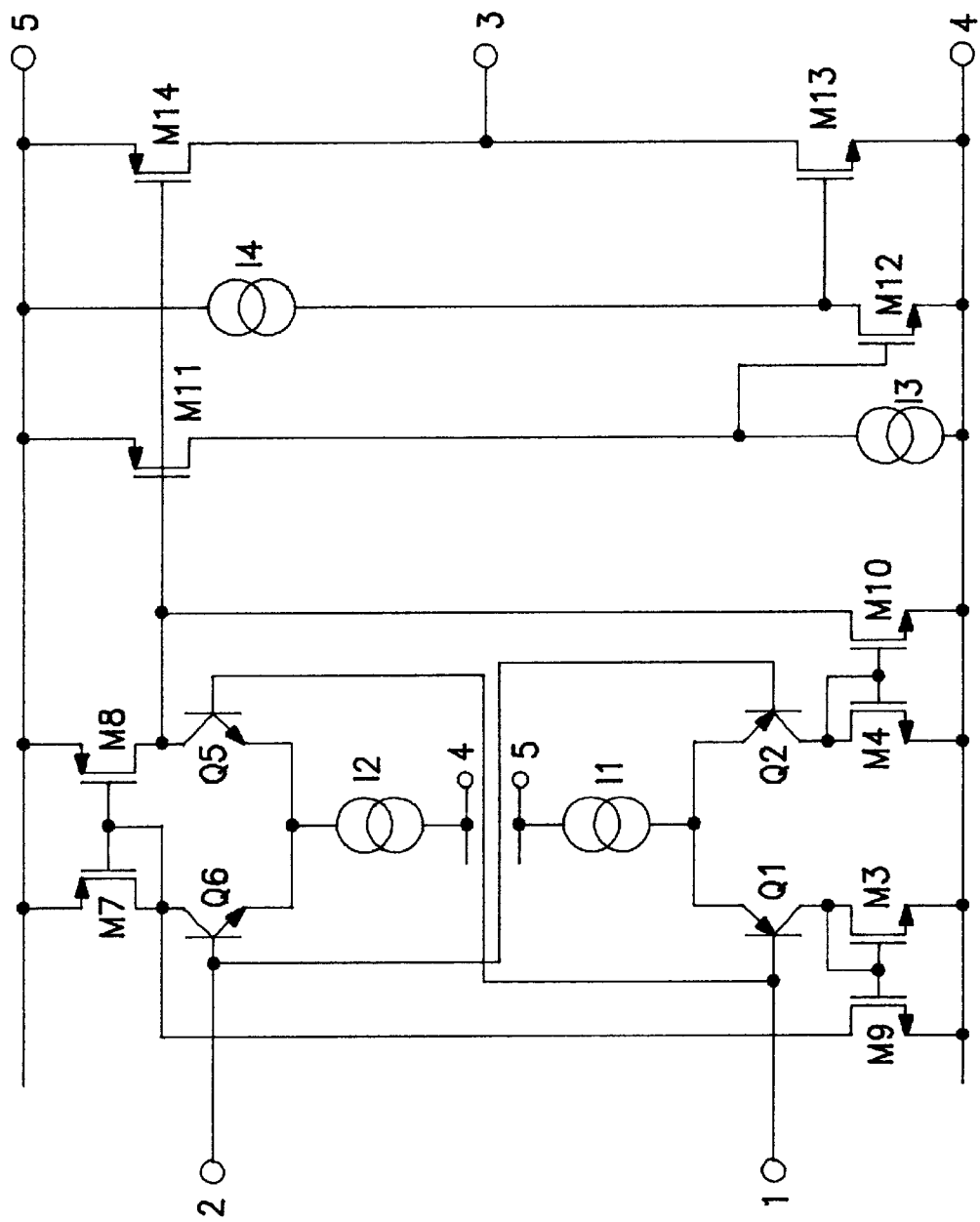
FIG. 8 is a circuit diagram illustrative of an improved operational amplifier in an eighth embodiment according to the present invention.

FIG. 8 is a circuit diagram illustrative of an improved operational amplifier in an eighth embodiment according to the present invention.

The operational amplifier provided in this embodiment differs from that in the sixth embodiment in opposite polarity of each elements on circuit configuration. The functions and effects of the operational amplifier are the same as in the fifth embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

NINTH EMBODIMENT

A ninth embodiment according to the present invention will be described in detail with reference to the accompanying drawings.

Figure 9:
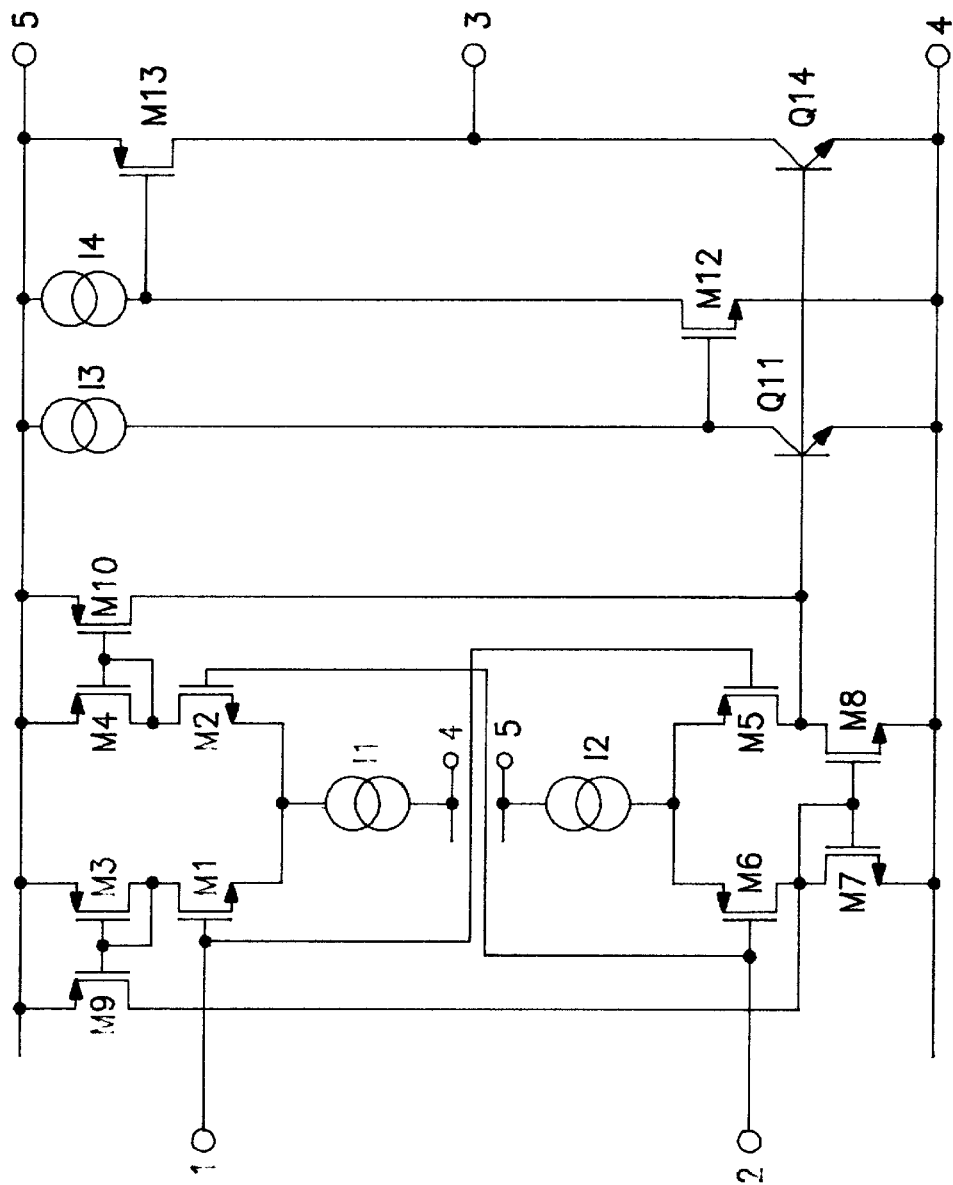
FIG. 9 is a circuit diagram illustrative of an improved operational amplifier in a ninth embodiment according to the present invention.

FIG. 9 is a circuit diagram illustrative of an improved operational amplifier in a ninth embodiment according to the present invention.

The operational amplifier provided in this embodiment differs in circuit configuration from that in the first embodiment as follows. In place of the MOS transistors M11 and M14, the n-p-n bipolar transistors Q11 and Q14 are provided.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a lower rise time than that using the MOS transistors.

TENTH EMBODIMENT

A tenth embodiment according to the present invention will be described in detail with reference to the accompanying drawings.

Figure 10:
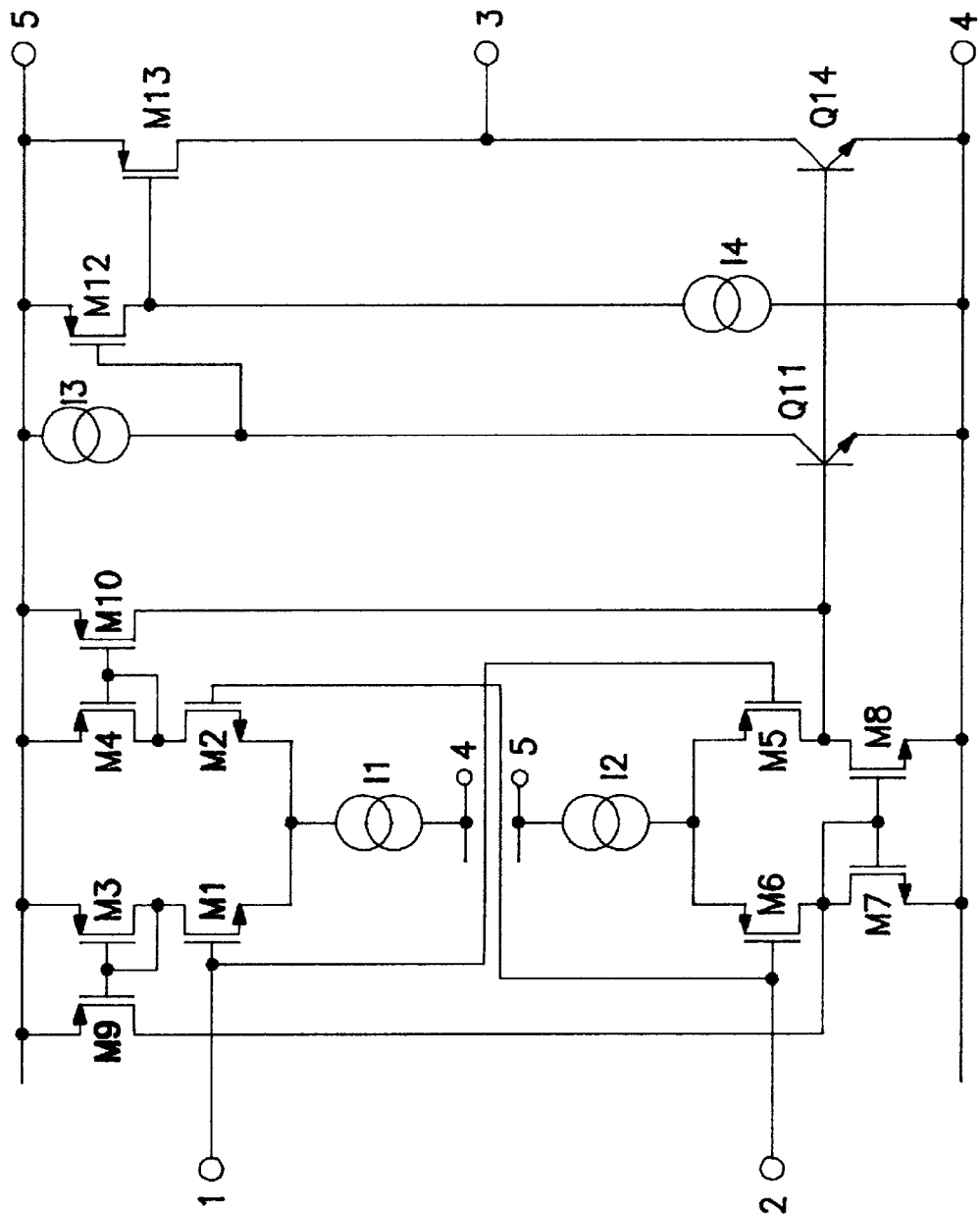
FIG. 10 is a circuit diagram illustrative of an improved operational amplifier in a tenth embodiment according to the present invention.

FIG. 10 is a circuit diagram illustrative of an improved operational amplifier in a tenth embodiment according to the present invention.

The operational amplifier provided in this embodiment differs in circuit configuration from that in the second embodiment as follows. In place of the MOS transistors M11 and M14, the n-p-n bipolar transistors Q11 and Q14 are provided.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a smaller rising time than that using the MOS transistors.

ELEVENTH EMBODIMENT

An eleventh embodiment according to the present invention will be described in detail with reference to the accompanying drawings.

Figure 11:
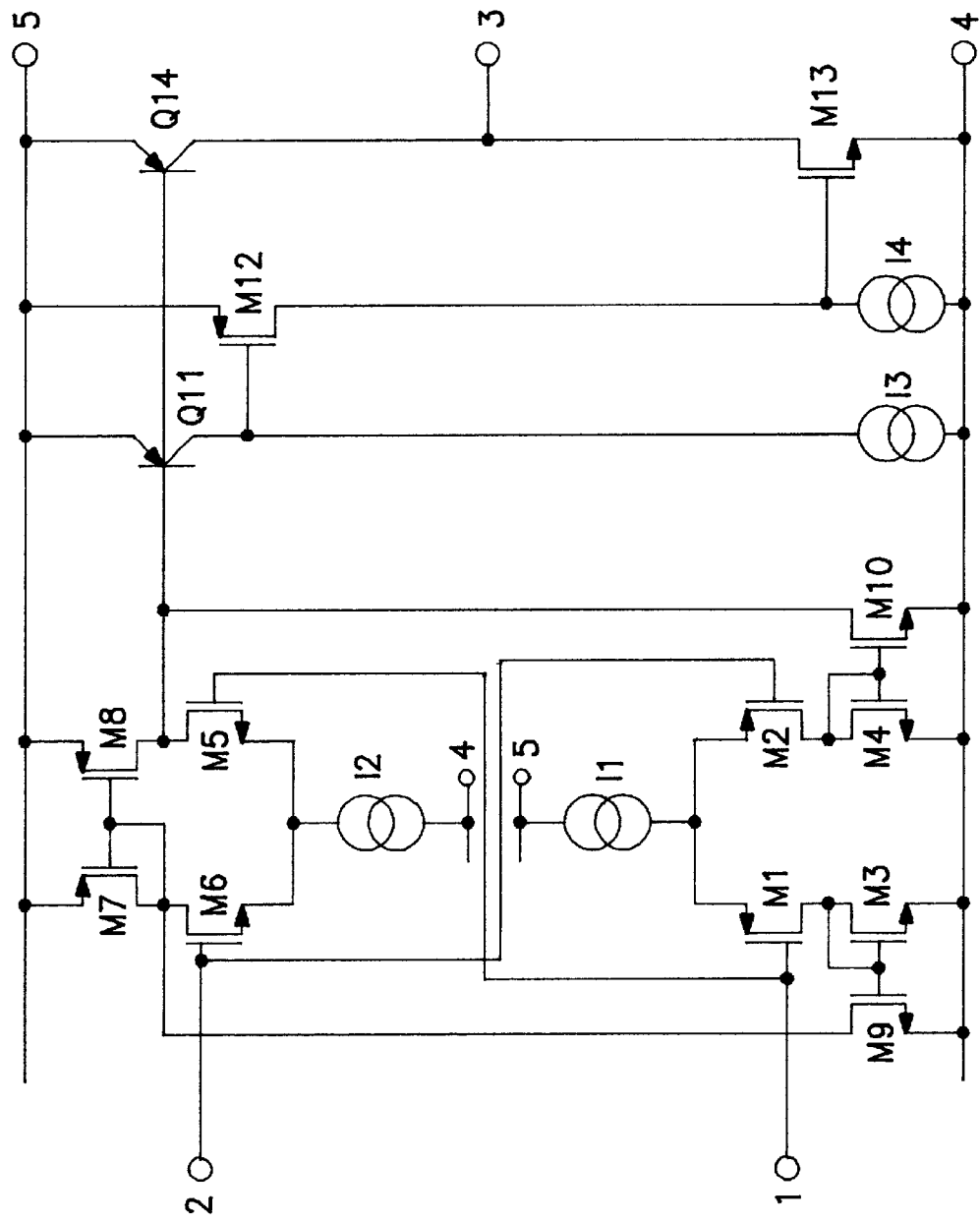
FIG. 11 is a circuit diagram illustrative of an improved operational amplifier in an eleventh embodiment according to the present invention.

FIG. 11 is a circuit diagram illustrative of an improved operational amplifier in an eleventh embodiment according to the present invention.

The operational amplifier provided in this embodiment differs from that in the ninth embodiment in opposite polarity of each elements on circuit configuration. The functions and effects of the operational amplifier are the same as in the fifth embodiment. The bipolar transistors Q11 and Q14 are p-n-p bipolar transistors. The first and second MOS transistors M2 and M1 comprise p-channel MOS transistors.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a lower rise time than that using the MOS transistors.

TWELFTH EMBODIMENT

A twelfth embodiment according to the present invention will be described in detail with reference to the accompanying drawings.

Figure 12:
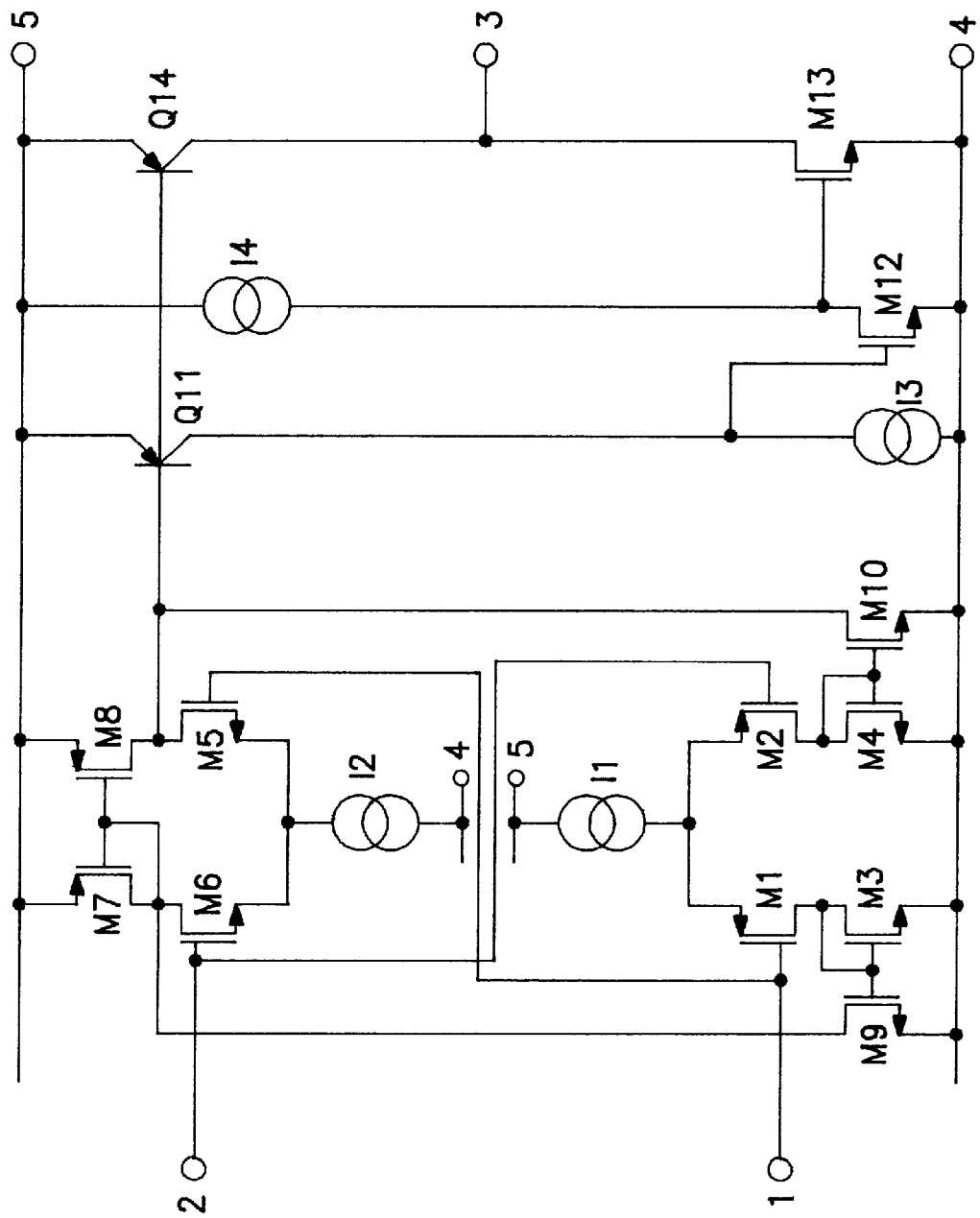
FIG. 12 is a circuit diagram illustrative of an improved operational amplifier in a twelfth embodiment according to the present invention.

FIG. 12 is a circuit diagram illustrative of an improved operational amplifier in a twelfth embodiment according to the present invention.

The operational amplifier provided in this embodiment differs from that in the ninth embodiment in opposite polarity of each elements on circuit configuration. The functions and effects of the operational amplifier are the same as in the fifth embodiment. The bipolar transistors Q11 and Q14 are p-n-p bipolar transistors. The first and second MOS transistors M2 and M1 comprise p-channel MOS transistors. The MOS transistors M1 and M2 comprise p-channel MOS transistors. The MOS transistors M5 and M6 comprise n-channel MOS transistors. The polarities of constant current sources I1 I2, I3, I4 are opposite to those in the ninth embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a lower rise time than that using the MOS transistors.

THIRTEENTH EMBODIMENT

A thirteenth embodiment according to the present invention will be described in detail with reference to the accompanying drawings.

Figure 13:
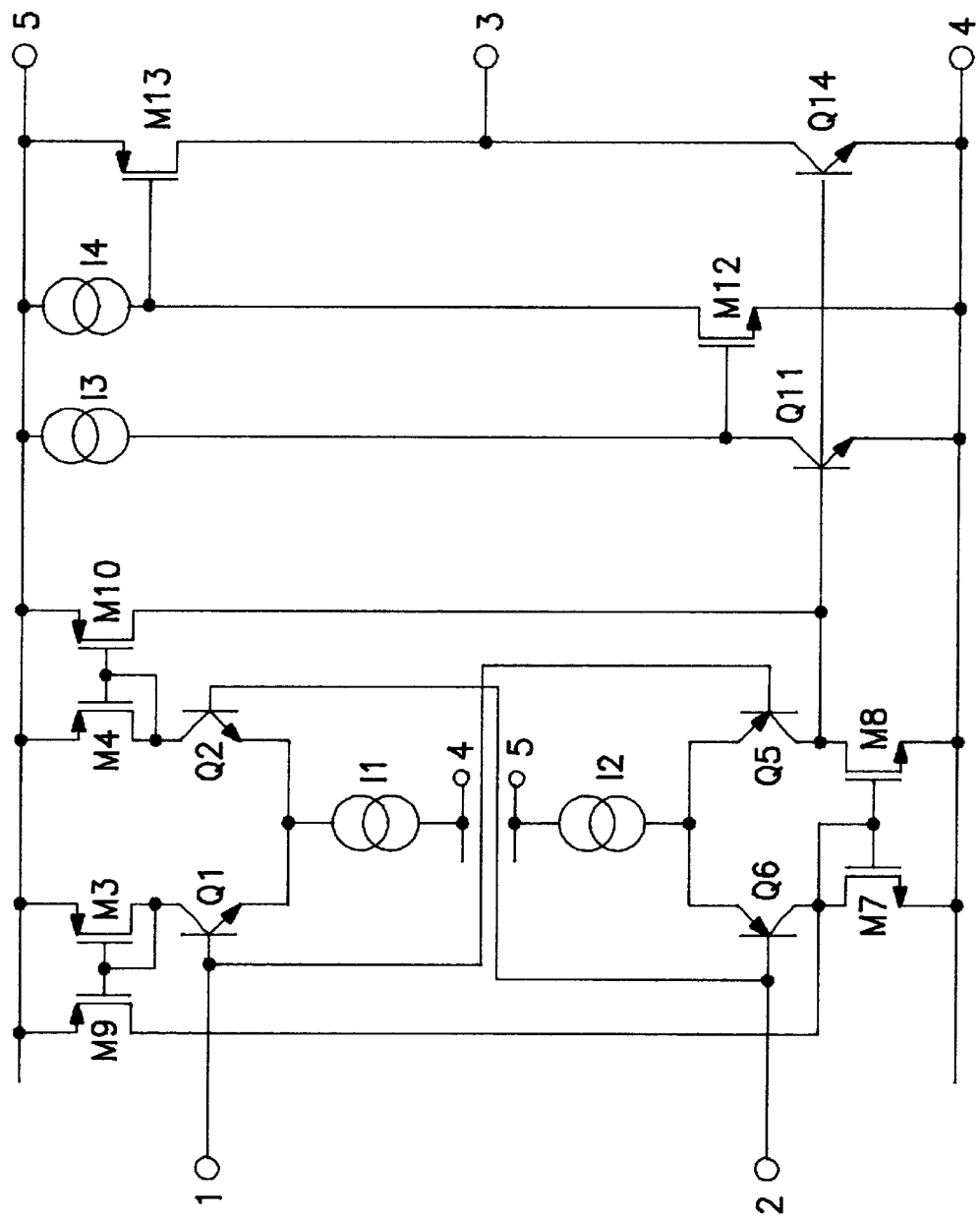
FIG. 13 is a circuit diagram illustrative of an improved operational amplifier in a thirteenth embodiment according to the present invention.

FIG. 13 is a circuit diagram illustrative of an improved operational amplifier in a thirteenth embodiment according to the present invention.

The operational amplifier provided in this embodiment differs in circuit configuration from that in the fifth embodiment as follows. In place of the MOS transistors M11 and M14, the n-p-n bipolar transistors Q11 and Q14 are provided.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a lower rise time than that using the MOS transistors.

FOURTEENTH EMBODIMENT

A fourteenth embodiment according to the present invention will be described in detail with reference to the accompanying drawings.

Figure 14:
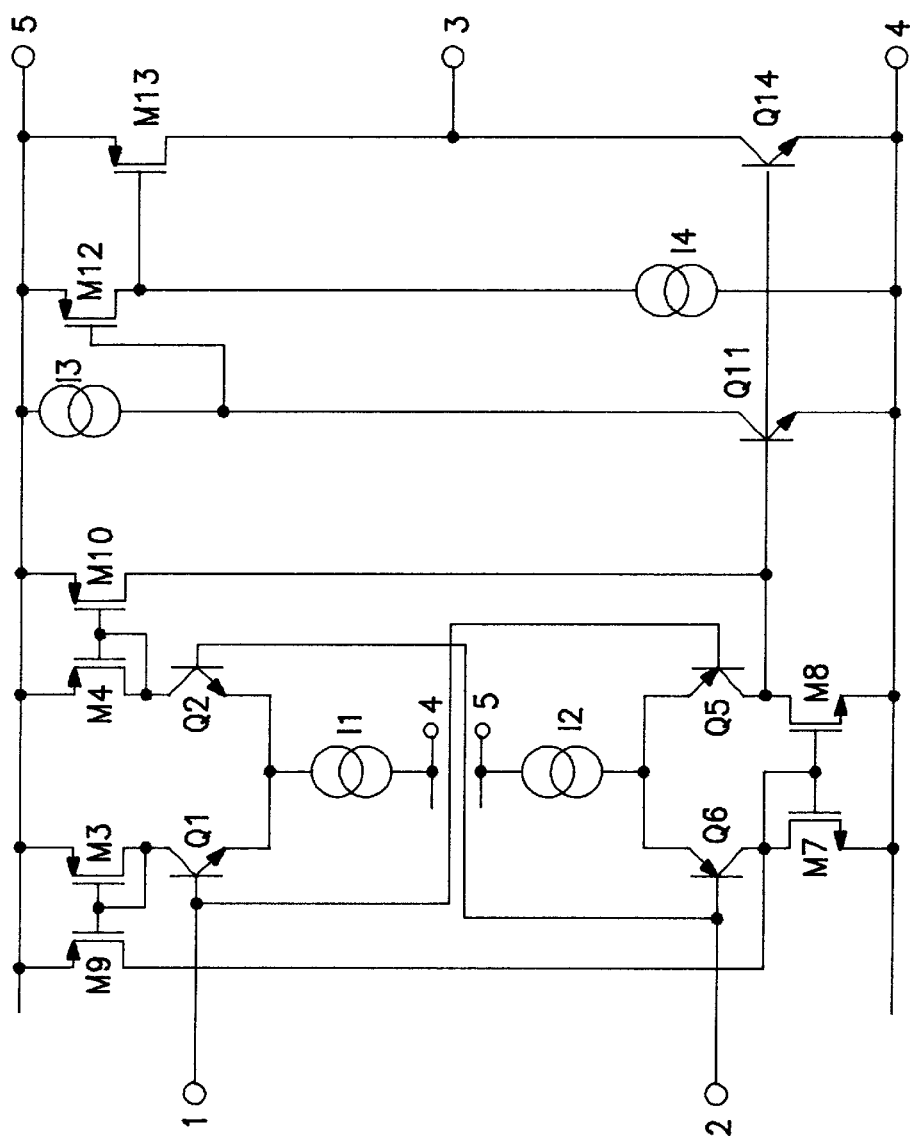
FIG. 14 is a circuit diagram illustrative of an improved operational amplifier in a fourteenth embodiment according to the present invention.

FIG. 14 is a circuit diagram illustrative of an improved operational amplifier in a fourteenth embodiment according to the present invention.

The operational amplifier provided in this embodiment differs in circuit configuration from that in the sixth embodiment as follows. In place of the MOS transistors M11 and M14, the n-p-n bipolar transistors Q11 and Q14 are provided.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a lower rise time than that using the MOS transistors.

FIFTEENTH EMBODIMENT

A fifteenth embodiment according to the present invention will be described in detail with reference to the accompanying drawings.

Figure 15:
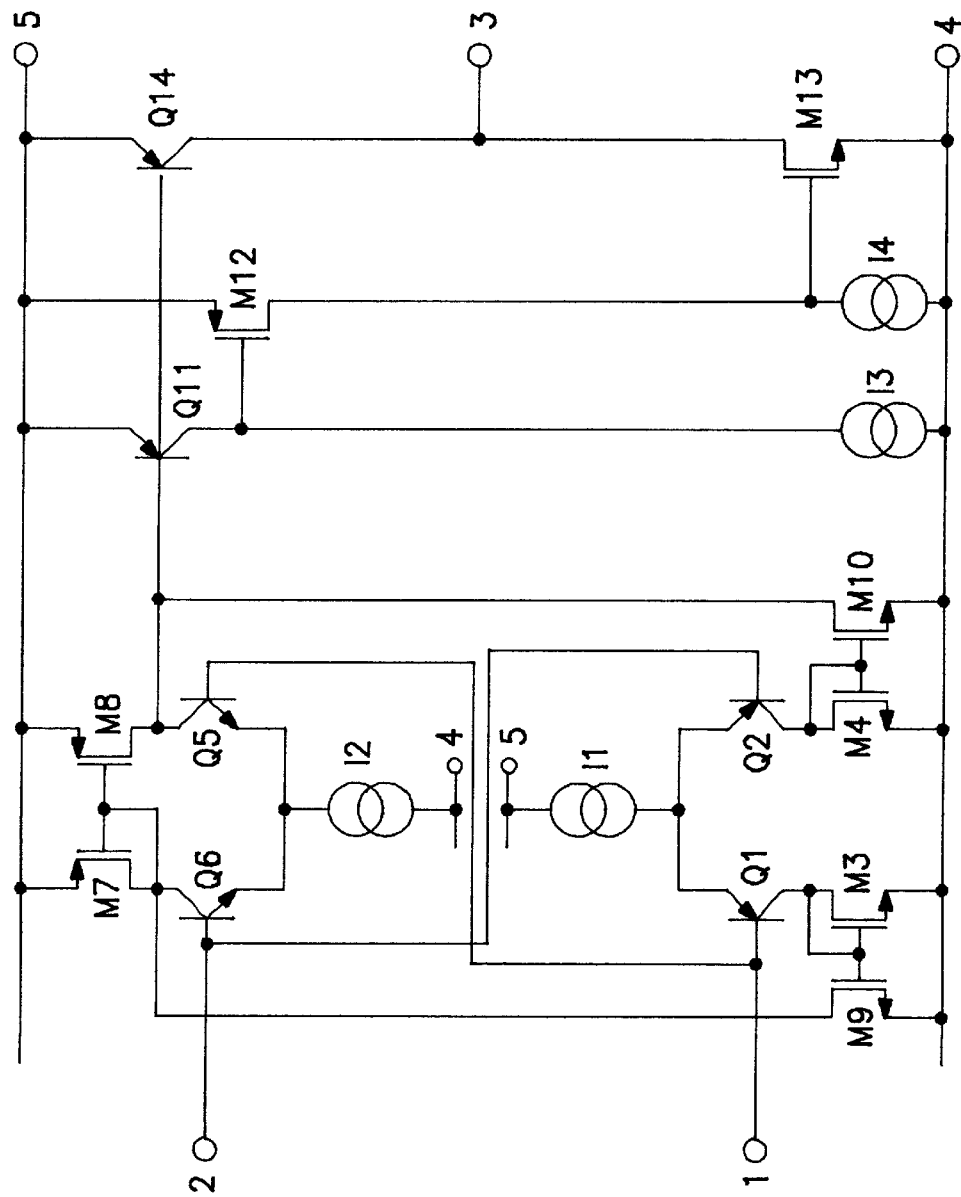
FIG. 15 is a circuit diagram illustrative of an improved operational amplifier in a fifteenth embodiment according to the present invention.

FIG. 15 is a circuit diagram illustrative of an improved operational amplifier in a fifteenth embodiment according to the present invention.

The operational amplifier provided in this embodiment differs from that in the thirteenth embodiment in opposite polarity of each elements on circuit configuration. The functions and effects of the operational amplifier are the same as in the thirteenth embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

SIXTEENTH EMBODIMENT

A sixteenth embodiment according to the present invention will be described in detail with reference to the accompanying drawings.

Figure 16:
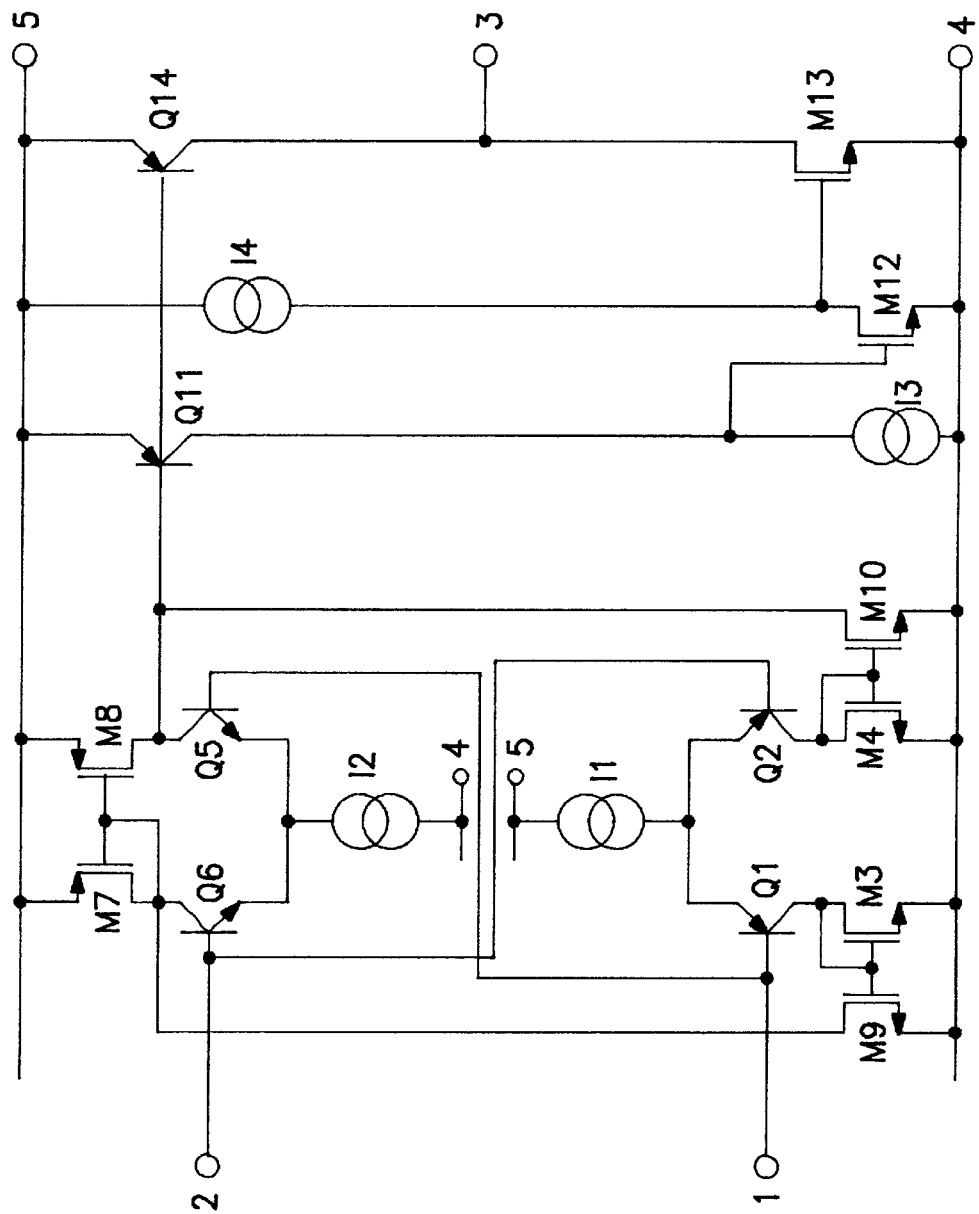
FIG. 16 is a circuit diagram illustrative of an improved operational amplifier in a sixteenth embodiment according to the present invention.

FIG. 16 is a circuit diagram illustrative of an improved operational amplifier in a sixteenth embodiment according to the present invention.

The operational amplifier provided in this embodiment differs from that in the fourteenth embodiment in opposite polarity of each elements on circuit configuration. The functions and effects of the operational amplifier are the same as in the fourteenth embodiment.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

The functions of the operational amplifiers using the MOS transistors and the bipolar transistors are substantially the same, but the bipolar transistors have larger transconductance than that of the MOS transistors, for which reason the operational amplifiers using the bipolar transistors has a larger gain and high accuracy.

SEVENTEENTH EMBODIMENT

A seventeenth embodiment according to the present invention will be described in detail with reference to the accompanying drawings.

Figure 17:
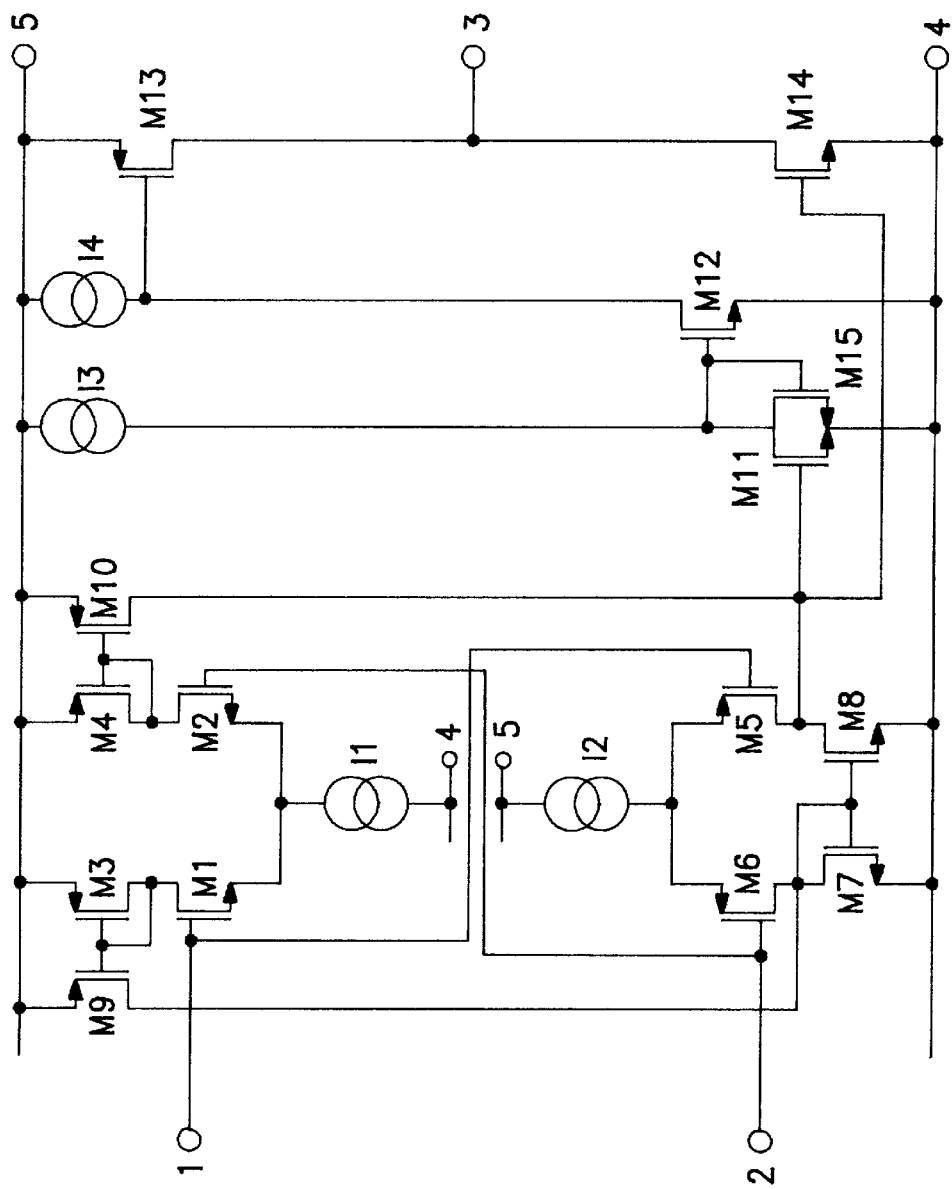
FIG. 17 is a circuit diagram illustrative of an improved operational amplifier in a seventeenth embodiment according to the present invention.

FIG. 17 is a circuit diagram illustrative of an improved operational amplifier in a seventeenth embodiment according to the present invention.

The operational amplifier provided in this embodiment differs in circuit configuration from that in the first embodiment as follows. An n-channel MOS transistor M15 is further provided, which has a source connected to the source of the second transistor M11, a drain connected to the drain of the second transistor M11 and a gate connected to the gate of the first transistor M12. The n-channel MOS transistor M15 makes the gate of the n-channel MOS transistor M12 low impedance to obtain improvements in high frequency performances.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

EIGHTEENTH EMBODIMENT

An eighteenth embodiment according to the present invention will be described in detail with reference to the accompanying drawings.

Figure 18:
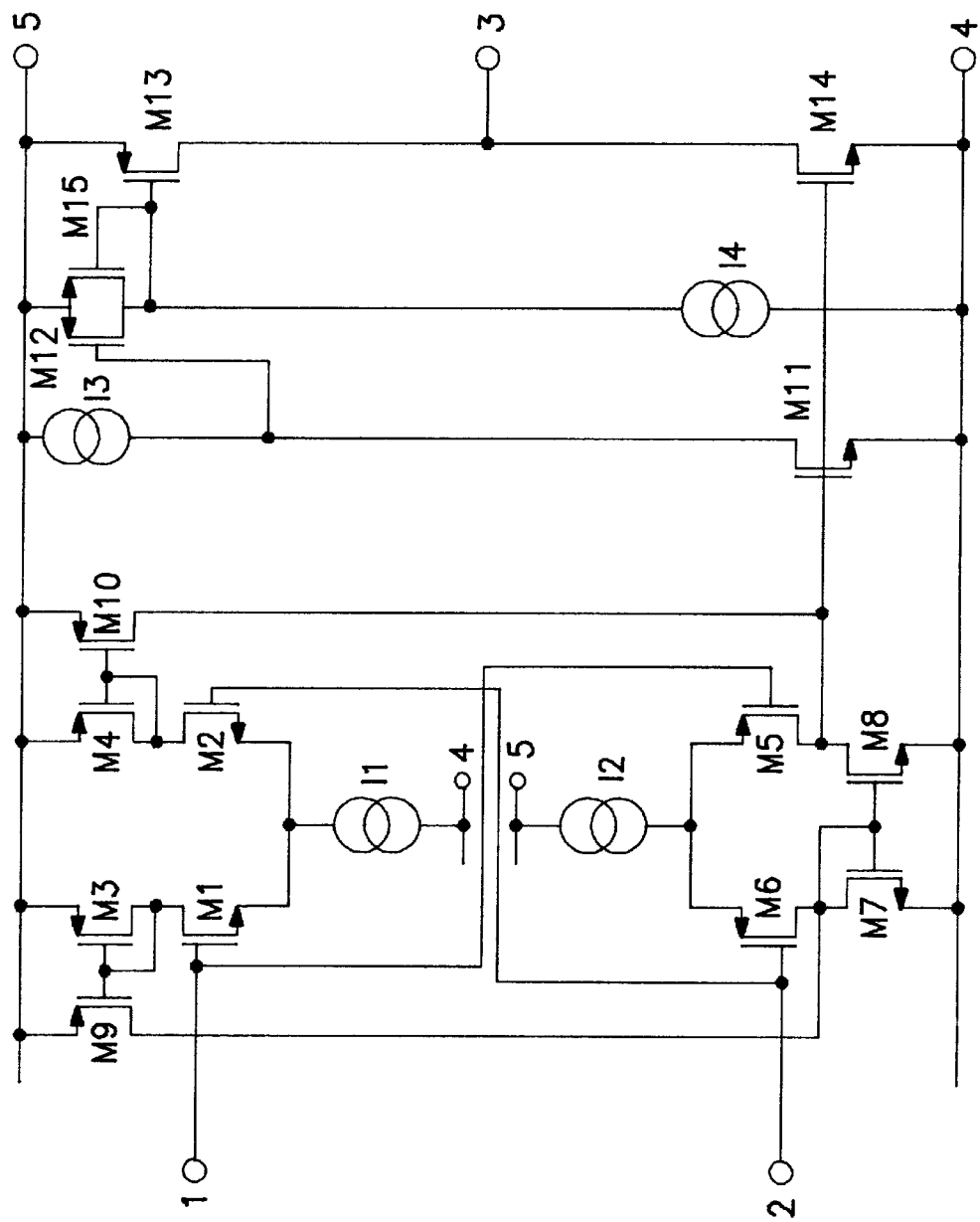
FIG. 18 is a circuit diagram illustrative of an improved operational amplifier in an eighteenth embodiment according to the present invention.

FIG. 18 is a circuit diagram illustrative of an improved operational amplifier in an eighteenth embodiment according to the present invention.

The operational amplifier provided in this embodiment differs in circuit configuration from that in the second embodiment as follows. An n-channel MOS transistor M15 is further provided, which has a source connected to the source of the second transistor M11, a drain connected to the drain of the second transistor M11 and a gate connected to the gate of the p-channel MOS transistor M13. The n-channel MOS transistor M11 makes the gate of the p-channel MOS transistor M13 low impedance to obtain improvements in high frequency performances.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

NINETEENTH EMBODIMENT

A nineteenth embodiment according to the present invention will be described in detail with reference to the accompanying drawings.

Figure 19:
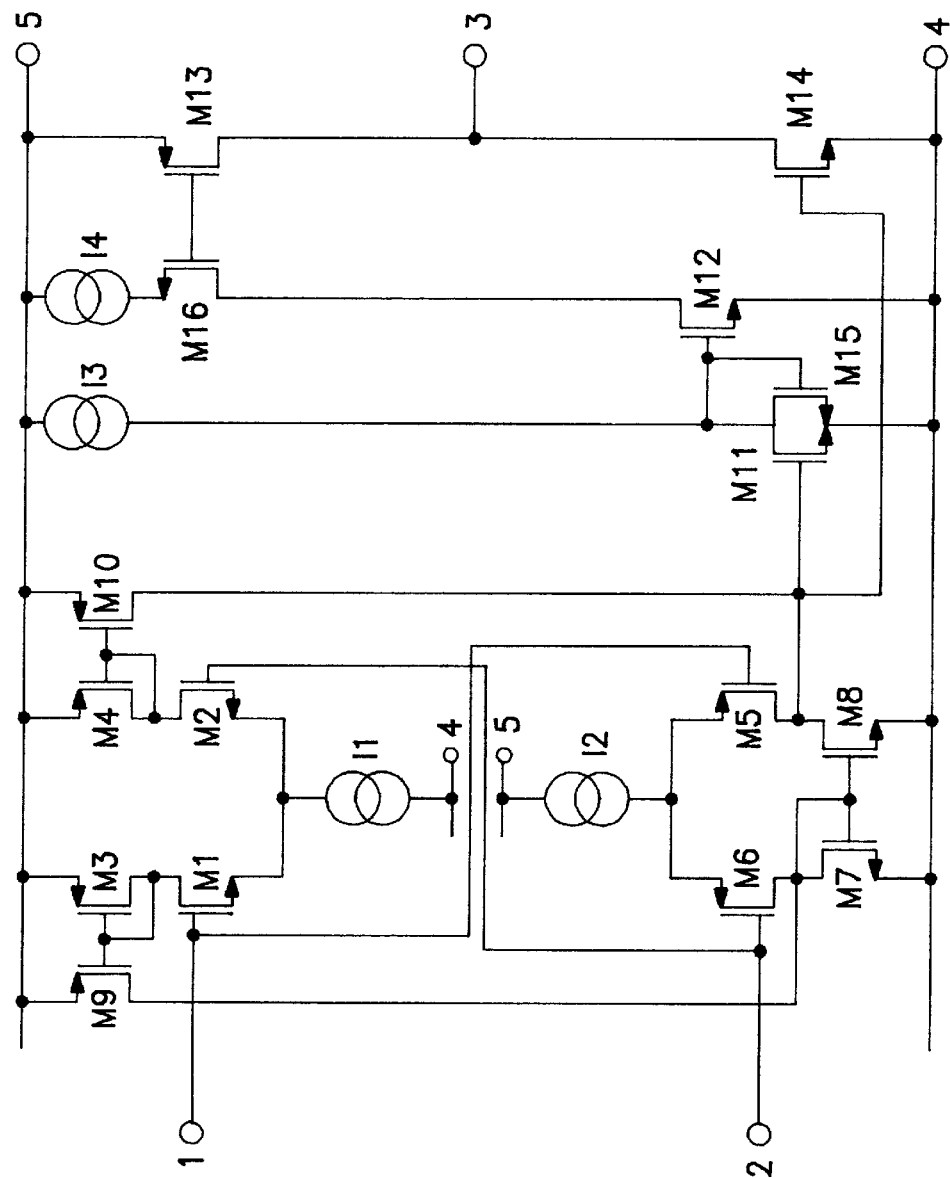
FIG. 19 is a circuit diagram illustrative of an improved operational amplifier in a nineteenth embodiment according to the present invention.

FIG. 19 is a circuit diagram illustrative of an improved operational amplifier in a nineteenth embodiment according to the present invention.

The operational amplifier provided in this embodiment differs in circuit configuration from that in the seventeenth embodiment as follows. In addition to the n-channel MOS transistor M15, an n-channel MOS transistor M16 is furthermore provided, which has a source connected to the first constant current source I4, a drain connected to the drain of the first transistor M12 and a gate connected to the gate of the p-channel MOS transistor M13. The n-channel MOS transistor M15 and the n-channel MOS transistor M16 make the gate of the p-channel MOS transistor M13 low impedance to obtain improvements in high frequency performances.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

TWENTIETH EMBODIMENT

A twentieth embodiment according to the present invention will be described in detail with reference to the accompanying drawings.

Figure 20:
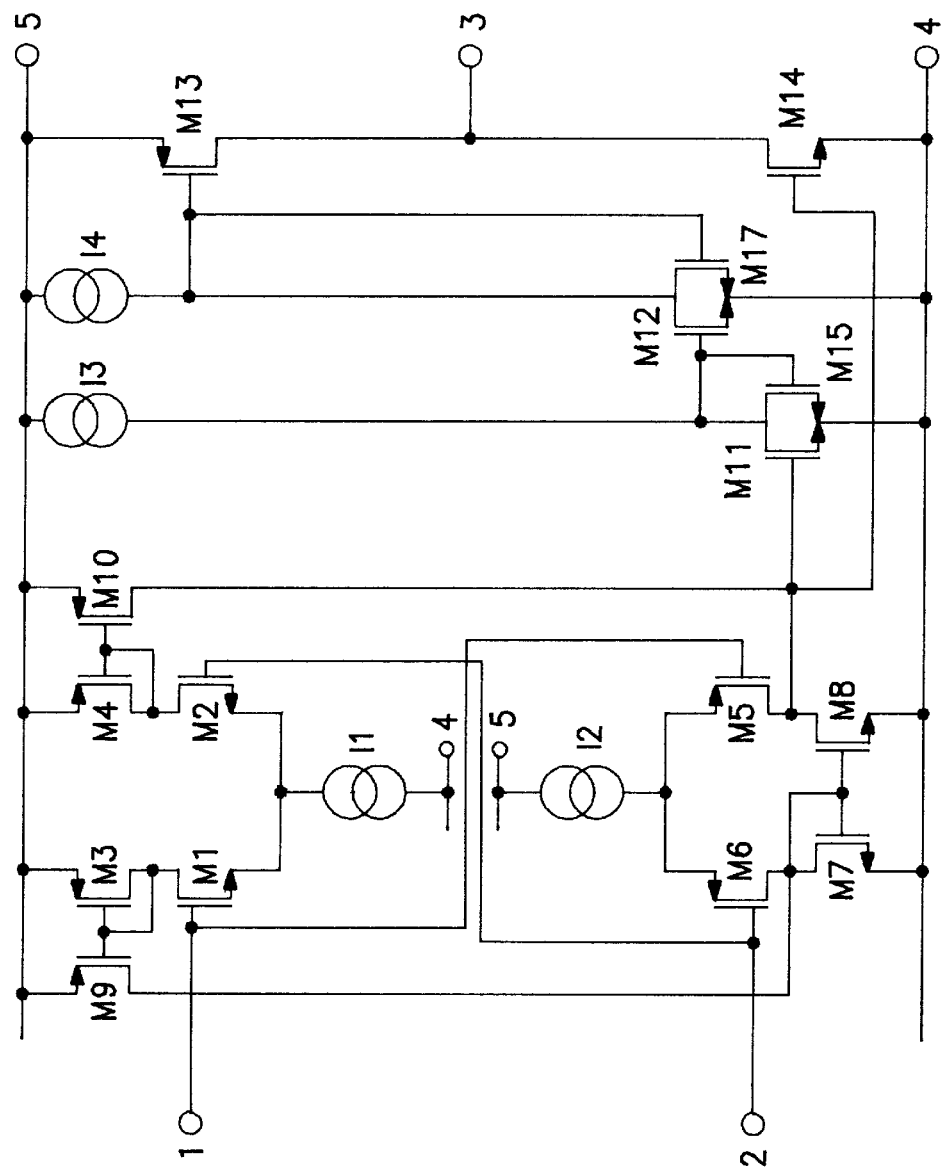
FIG. 20 is a circuit diagram illustrative of an improved operational amplifier in a twentieth embodiment according to the present invention.

FIG. 20 is a circuit diagram illustrative of an improved operational amplifier in a twentieth embodiment according to the present invention.

The operational amplifier provided in this embodiment differs in circuit configuration from that in the seventeenth embodiment as follows. In addition to the n-channel MOS transistor M15, an n-channel MOS transistor M17 is furthermore provided, which has a source connected to the source of the first transistor M12, a drain connected to the drain of the first transistor M12 and a gate connected to the source of the first transistor M12. The n-channel MOS transistor M15 and the n-channel MOS transistor M17 make the gate of the p-channel MOS transistor M13 low impedance to obtain improvements in high frequency performances.

The above operational amplifier has wide input and output ranges and shows rapid increase and decrease of the potential of the output terminal 3. Further, the idling current is free from any influence of variations in absolute threshold values of the transistors. It is further possible to suppress any punch through current in response to the discharge current flowing in the discharge operation over the operational amplifier.

Whereas modifications of the present invention will be apparent o a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An intermediate circuitry connected between an input stage and an output stage in an operational amplifier, said input stage and said output stage being biased between a high voltage line and a low voltage line, said intermediate circuitry being also biased between said high voltage line and said low voltage line, said intermediate circuitry comprising:

at least a first pair of a first transistor and a first constant current source, both of which are connected in series to each other between said high voltage line and said low voltage line, said first pair being adjacent to said output stage, a first intermediate point between said first transistor and said first constant current source being connected to said output stage; and at least a second pair of a second transistor and a second constant current source, both of which are connected in series to each other between said high voltage line and said low voltage line, said second pair being in parallel to said first pair and being adjacent to said input stage, a second intermediate point between said second transistor and said second constant current source being connected to a control electrode of said first transistor, a control gate of said second transistor being connected to said input stage.

2. The intermediate circuitry as claimed in claim 1, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, and wherein said input stage includes at least a differential amplifier circuit.

3. The intermediate circuitry as claimed in claim 2, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises a second conductivity type MOS transistor having a source connected to said low voltage line, a drain connected to said second constant current source and also connected to a gate of said second conductivity type MOS transistor as said first transistor and a gate connected to said input stage and also connected to a gate of said second conductivity type MOS transistor in said output stage; and said second constant current source is connected to said high voltage line.

4. The intermediate circuitry as claimed in claim 3, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

5. The intermediate circuitry as claimed in claim 2, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line;

said second transistor comprises a second conductivity type MOS transistor having a source connected to said low voltage line, a drain connected to said second constant current source and also connected to a gate of said first conductivity type MOS transistor as said first transistor and a gate connected to said input stage and also connected to a gate of said second conductivity type MOS transistor in said output stage; and said second constant current source is connected to said high voltage line.

6. The intermediate circuitry as claimed in claim 5, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

7. The intermediate circuitry as claimed in claim 2, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line;

said second transistor comprises a first conductivity type MOS transistor having a source connected to said high voltage line, a drain connected to said second constant current source and also connected to a gate of said first conductivity type MOS transistor as said first transistor and a gate connected to said input stage and also connected to a gate of said first conductivity type MOS transistor in said output stage; and said second constant current source is connected to said low voltage line.

8. The intermediate circuitry as claimed in claim 7, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

9. The intermediate circuitry as claimed in claim 2, wherein said first transistor comprises a second conductivity type MOS transistor having a source connected to said low voltage line, and a drain connected to said first constant current source and also connected to a gate of said second conductivity type MOS transistor in said output stage;

said first constant current source is connected to said high voltage line;

said second transistor comprises a first conductivity type MOS transistor having a source connected to said high voltage line, a drain connected to said second constant current source and also connected to a gate of said second conductivity type MOS transistor as said first transistor and a gate connected to said input stage and also connected to a gate of said first conductivity type MOS transistor in said output stage; and said second constant current source is connected to said low voltage line.

10. The intermediate circuitry as claimed in claim 9, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

11. The intermediate circuitry as claimed in claim 1, wherein said output stage comprises a first conductivity type MOS transistor and an second conductivity type bipolar transistor, both of which are connected in series to each other between said high voltage line and said low voltage line, said first conductivity type MOS transistor is connected to said high voltage line and said second conductivity type bipolar transistor is connected to said low voltage line.

12. The intermediate circuitry as claimed in claim 11, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises an second conductivity type bipolar transistor having an emitter connected to said low voltage line, a collector connected to said second constant current source and also connected to a gate of said second conductivity type MOS transistor as said first transistor and a base connected to said input stage and also connected to a base of said second conductivity type bipolar transistor in said output stage; and said second constant current source is connected to said high voltage line.

13. The intermediate circuitry as claimed in claim 12, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said second conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said second conductivity type bipolar transistor in said output stage.

14. The intermediate circuitry as claimed in claim 11, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line;

said second transistor comprises an second conductivity type bipolar transistor having an emitter connected to said low voltage line, a collector connected to said second constant current source and also connected to a gate of said first conductivity type MOS transistor as said first transistor and a base connected to said input stage and also connected to a base of said second conductivity type bipolar transistor in said output stage; and said second constant current source is connected to said high voltage line.

15. The intermediate circuitry as claimed in claim 14, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said second conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said second conductivity type bipolar transistor in said output stage.

16. The intermediate circuitry as claimed in claim 1, wherein said output stage comprises a second conductivity type MOS transistor and a first conductivity type bipolar transistor, both of which are connected in series to each other between said high voltage line and said low voltage line, said second conductivity type MOS transistor is connected to said low voltage line and said first conductivity type bipolar transistor is connected to said high voltage line.

17. The intermediate circuitry as claimed in claim 16, wherein said first transistor comprises a first conductivity type MOS transistor having a source connected to said high voltage line, and a drain connected to said first constant current source and also connected to a gate of said second conductivity type MOS transistor in said output stage;

said first constant current source is connected to said low voltage line;

said second transistor comprises a first conductivity type bipolar transistor having an emitter connected to said high voltage line, a drain connected to said second constant current source and also connected to a gate of said first conductivity type MOS transistor as said first transistor and a base connected to said input stage and also connected to a base of said first conductivity type bipolar transistor in said output stage; and said second constant current source is connected to said low voltage line.

18. The intermediate circuitry as claimed in claim 17, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said first conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said first conductivity type bipolar transistor in said output stage.

19. The intermediate circuitry as claimed in claim 16, wherein said first transistor comprises a second conductivity type MOS transistor having a source connected to said low voltage line, and a drain connected to said first constant current source and also connected to a gate of said second conductivity type MOS transistor in said output stage;

said first constant current source is connected to said high voltage line;

said second transistor comprises a first conductivity type bipolar transistor having an emitter connected to said high voltage line, a collector connected to said second constant current source and also connected to a gate of said second conductivity type MOS transistor as said first transistor and a base connected to said input stage and also connected to a base of said first conductivity type bipolar transistor in said output stage; and said second constant current source is connected to said low voltage line.

20. The intermediate circuitry as claimed in claim 19, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said first conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said first conductivity type bipolar transistor in said output stage.

21. The intermediate circuitry as claimed in claim 1, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, wherein said input stage includes at least a differential amplifier circuit, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises a second conductivity type MOS transistor having a source connected to said low voltage line, a drain connected to said second constant current source and also connected to a gate of said second conductivity type MOS transistor as said first transistor and a gate connected to said input stage and also connected to a gate of said second conductivity type MOS transistor in said output stage; and said second constant current source is connected to said high voltage line, and wherein said intermediate circuitry further comprises a first additional second conductivity type MOS transistor having a source connected to said source of said second conductivity type MOS transistor as said second transistor, a drain connected to said drain of said second conductivity type MOS transistor as said second transistor, and a gate connected to said gate of said second conductivity type MOS transistor as said first transistor and also connected to said drain of said second conductivity type MOS transistor as said second transistor.

22. The intermediate circuitry as claimed in claim 21, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

23. The intermediate circuitry as claimed in claim 21, further comprising a first additional first conductivity type MOS transistor having a source connected to said first constant current source, a drain connected to said drain of said second conductivity type MOS transistor as said first transistor, and a gate connected to said gate of said first conductivity type MOS transistor in said output stage.

24. The intermediate circuitry as claimed in claim 21, further comprising a second additional second conductivity type MOS transistor having a source connected to said source of said second conductivity type MOS transistor as said first transistor, a drain connected to said drain of said second conductivity type MOS transistor as said first transistor, and a gate connected to said drain of said second conductivity type MOS transistor as said first transistor.

25. The intermediate circuitry as claimed in claim 1, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, wherein said input stage includes at least a differential amplifier circuit, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line, said second transistor comprises a second conductivity type MOS transistor having a source connected to said low voltage line, a drain connected to said second constant current source and also connected to a gate of said first conductivity type MOS transistor as said first transistor and a gate connected to said input stage and also connected to a gate of said second conductivity type MOS transistor in said output stage; and said second constant current source is connected to said high voltage line, and wherein said intermediate circuitry further comprises a first additional first conductivity type MOS transistor having a source connected to said source of said first conductivity type MOS transistor as said first transistor, a drain connected to said drain of said first conductivity type MOS transistor as said first transistor, and a gate connected to said gate of said first conductivity type MOS transistor in said output stage and also connected to said drain of said first conductivity type MOS transistor as said first transistor.

26. The intermediate circuitry as claimed in claim 25, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

27. An operational amplifier comprising an input stage, an output stage, and an intermediate circuitry connected between said input stage and said output stage, said operational amplifier being biased between a high voltage line and a low voltage line, said input stage including at least an amplifier circuit, wherein said intermediate circuitry comprises:

at least a first pair of a first transistor and a first constant current source, both of which are connected in series to each other between said high voltage line and said low voltage line, said first pair being adjacent to said output stage, a first intermediate point between said first transistor and said first constant current source being connected to said output stage; and at least a second pair of a second transistor and a second constant current source, both of which are connected in series to each other between said high voltage line and said low voltage line, said second pair being in parallel to said first pair and being adjacent to said input stage, a second intermediate point between said second transistor and said second constant current source being connected to a control electrode of said first transistor, a control gate of said second transistor being connected to said input stage.

28. The operational amplifier as claimed in claim 27, wherein said amplifier circuit in said input stage comprises a differential amplifier circuit.

29. The operational amplifier as claimed in claim 27, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, and wherein said input stage includes at least a differential amplifier circuit.

30. The operational amplifier as claimed in claim 29, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises a second conductivity type MOS transistor having a source connected to said low voltage line, a drain connected to said second constant current source and also connected to a gate of said second conductivity type MOS transistor as said first transistor and a gate connected to said input stage and also connected to a gate of said second conductivity type MOS transistor in said output stage; and said second constant current source is connected to said high voltage line.

31. The operational amplifier as claimed in claim 30, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

32. The operational amplifier as claimed in claim 31, wherein said first differential amplifier circuit comprises:

a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;

a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected to said second differential amplifier circuit and also connected to said gate of said second conductivity type MOS transistor as said second transistor of said intermediate circuitry, and a gate connected to said gate of said second second conductivity type MOS transistor of said first differential transistor pair; and wherein said second differential amplifier circuit comprises:

a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said gate of said second conductivity type MOS transistor as said second transistor of said intermediate circuitry, and a gate connected to said drain of said first first conductivity type MOS transistor of said second differential transistor pair.

33. The operational amplifier as claimed in claim 31, wherein said first differential amplifier circuit comprises:

a first differential transistor pair of first and second second conductivity type bipolar transistors connected to each other via emitters thereof which are connected via a constant current source to said low voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a collector of said first second conductivity type bipolar transistor of said first differential transistor pair, and a gate connected to said collector of said first second conductivity type bipolar transistor of said first differential transistor pair, and said second first conductivity type MOS transistor having a source connected to said high voltage line, a drain connected to said second differential amplifier circuit, and a gate connected to said collector of said first second conductivity type bipolar transistor of said first differential transistor pair;

a second current mirror circuit comprising a pair of third and fourth first conductivity type MOS transistors, said third first conductivity type MOS transistor having a source connected to said high voltage line, a drain connected to a collector of said second second conductivity type bipolar transistor of said first differential transistor pair, and a gate connected to said collector of said second second conductivity type bipolar transistor of said first differential transistor pair, and said fourth first conductivity type MOS transistor having a source connected to said high voltage line, a drain connected to said second differential amplifier circuit and also connected to said gate of said second conductivity type MOS transistor as said second transistor of said intermediate circuitry, and a gate connected to said collector of said second second conductivity type bipolar transistor of said first differential transistor pair; and wherein said second differential amplifier circuit comprises:

a second differential transistor pair of first and second first conductivity type bipolar transistors connected to each other via emitters thereof which are connected via a constant current source to said high voltage line, a base of said first first conductivity type bipolar transistor of said second differential transistor pair being connected to said second input terminal, a gate of said second first conductivity type bipolar transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a collector of said first first conductivity type bipolar transistor of said second differential transistor pair, a gate connected to said collector of said first first conductivity type bipolar transistor of said second differential transistor pair, and said second second conductivity type MOS transistor having a source connected to said low voltage line, a drain connected to a collector of said second first conductivity type bipolar transistor of said second differential transistor pair and also connected to said gate of said second conductivity type MOS transistor as said second transistor of said intermediate circuitry, and a gate connected to said collector of said first first conductivity type bipolar transistor of said second differential transistor pair.

34. The operational amplifier as claimed in claim 29, wherein
said first transistor comprises a first conductivity type MOS transistor having a source connected to said high voltage line, and a drain connected to said first constant current source and also connected to a gate of said first conductivity type MOS transistor in said output stage;
said first constant current source is connected to said low voltage line;
said second transistor comprises a second conductivity type MOS transistor having a source connected to said low voltage line, a drain connected to said second constant current source and also connected to a gate of said first conductivity type MOS transistor as said first transistor and a gate connected to said input stage and also connected to a gate of said second conductivity type MOS transistor in said output stage; and
said second constant current source is connected to said high voltage line.

35. The operational amplifier as claimed in claim 34, wherein said input stage comprises:
a first input terminal for receiving first input signals;
a second input terminal for receiving second input signals;
a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and
a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

36. The operational amplifier as claimed in claim 35, wherein said first differential amplifier circuit comprises:
a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;
a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;
a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected to said second differential amplifier circuit and also connected to said gate of said second conductivity type MOS transistor as said second transistor of said intermediate circuitry, and a gate connected to said gate of said second second conductivity type MOS transistor of said first differential transistor pair; and
wherein said second differential amplifier circuit comprises:
a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;
a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said gate of said second conductivity type MOS transistor as said second transistor of said intermediate circuitry, and a gate connected to said gate of said first first conductivity type MOS transistor of said second differential transistor pair.

37. The operational amplifier as claimed in claim 35, wherein said first differential amplifier circuit comprises:
a first differential transistor pair of first and second second conductivity type bipolar transistors connected to each other via emitters thereof which are connected via a constant current source to said low voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a collector of said first second conductivity type bipolar transistor of said first differential transistor pair, and a gate connected to said collector of said first second conductivity type bipolar transistor of said first differential transistor pair, and said second first conductivity type MOS transistor having a source connected to said high voltage line, a drain connected to said second differential amplifier circuit, and a gate connected to said collector of said first second conductivity type bipolar transistor of said first differential transistor pair;

a second current mirror circuit comprising a pair of third and fourth first conductivity type MOS transistors, said third first conductivity type MOS transistor having a source connected to said high voltage line, a drain connected to a collector of said second second conductivity type bipolar transistor of said first differential transistor pair, and a gate connected to said collector of said second second conductivity type bipolar transistor of said first differential transistor pair, and said fourth first conductivity type MOS transistor having a source connected to said high voltage line, a drain connected to said second differential amplifier circuit and also connected to said gate of said second conductivity type MOS transistor as said second transistor of said intermediate circuitry, and a gate connected to said collector of said second second conductivity type bipolar transistor of said first differential transistor pair; and wherein said second differential amplifier circuit comprises:

a second differential transistor pair of first and second first conductivity type bipolar transistors connected to each other via emitters thereof which are connected via a constant current source to said high voltage line, a base of said first first conductivity type bipolar resistor of said second differential transistor pair being connected to said second input terminal, a gate of said second first conductivity type bipolar transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a collector of said first first conductivity type bipolar transistor of said second differential transistor pair, a gate connected to said collector of said first first conductivity type bipolar transistor of said second differential transistor pair, and said second second conductivity type MOS transistor having a source connected to said low voltage line, a drain connected to a collector of said second first conductivity type bipolar transistor of said second differential transistor pair and also connected to said gate of said second conductivity type MOS transistor as said second transistor of said intermediate circuitry, and a gate connected to said collector of said first first conductivity type bipolar transistor of said second differential transistor pair.

38. The operational amplifier as claimed in claim 29, wherein said first transistor comprises a first conductivity type MOS transistor having a source connected to said high voltage line, and a drain connected to said first constant current source and also connected to a gate of said second conductivity type MOS transistor in said output stage;

said first constant current source is connected to said low voltage line;

said second transistor comprises a first conductivity type MOS transistor having a source connected to said high voltage line, a drain connected to said second constant current source and also connected to a gate of said first conductivity type MOS transistor as said first transistor and a gate connected to said input stage and also connected to a gate of said first conductivity type MOS transistor in said output stage; and said second constant current source is connected to said low voltage line.

39. The operational amplifier as claimed in claim 38, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said first conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said first conductivity type MOS transistor in said output stage.

40. The operational amplifier as claimed in claim 39, wherein said first differential amplifier circuit comprises:

a first differential transistor pair of first and second first conductivity type MOS transistors connected to each other via sources thereof which are connected via a constant current source to said high voltage line, a gate of said first first conductivity type MOS transistor of said first differential transistor pair being connected to said first input terminal, a gate of said second first conductivity type MOS transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a drain of said first first conductivity type MOS transistor of said first differential transistor pair, and a gate connected to said drain of said first first conductivity type MOS transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth first conductivity type MOS transistors, said third second conductivity type MOS transistor having a source connected to said low voltage line, a drain connected to a drain of said second first conductivity type MOS transistor of said first differential transistor pair, and a gate connected to said drain of said second first conductivity type MOS transistor of said first differential transistor pair, and said fourth second conductivity type MOS transistor having a source connected to said low voltage line, a drain connected to said second differential amplifier circuit and also connected to said gate of said first conductivity type MOS transistor as said second transistor of said intermediate circuitry, and a gate connected to said gate of said second second conductivity type MOS transistor of said second current mirror circuit; and wherein said second differential amplifier circuit comprises:

a second differential transistor pair of first and second second conductivity type MOS transistors connected to each other via sources thereof which are connected via a constant current source to said low voltage line, a gate of said first second conductivity type MOS transistor of said second differential transistor pair being connected to said second input terminal, a gate of said second second conductivity type MOS transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a drain of said first second conductivity type MOS transistor of said second differential transistor pair, a gate connected to said drain of said first second conductivity type MOS transistor of said second differential transistor pair, and said second first conductivity type MOS transistor having a source connected to said high voltage line, a drain connected to a drain of said second second conductivity type MOS transistor of said second differential transistor pair and also connected to said gate of said first conductivity type MOS transistor as said second transistor of said intermediate circuitry, and a gate connected to said gate of said first second conductivity type MOS transistor of said second differential transistor pair.

41. The operational amplifier as claimed in claim 39, wherein said first differential amplifier circuit comprises:

a first differential transistor pair of first and second first conductivity type bipolar transistors connected to each other via emitters thereof which are connected via a constant current source to said high voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a collector of said first first conductivity type bipolar transistor of said first differential transistor pair, and a gate connected to said collector of said first first conductivity type bipolar transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth second conductivity type MOS transistors, said third second conductivity type MOS transistor having a source connected to said low voltage line, a drain connected to a collector of said second first conductivity type bipolar transistor of said first differential transistor pair, and a gate connected to said collector of said second first conductivity type bipolar transistor of said first differential transistor pair, and said fourth second conductivity type MOS transistor having a source connected to said low voltage line, a drain connected to said second differential amplifier circuit and also connected to said gate of said first conductivity type MOS transistor as said second transistor of said intermediate circuitry, and a gate connected to said gate of said first second conductivity type MOS transistor of said second current mirror circuit; and wherein said second differential amplifier circuit comprises:

a second differential transistor pair of first and second second conductivity type bipolar transistors connected to each other via emitters thereof which are connected via a constant current source to said low voltage line, a base of said first second conductivity type bipolar transistor of said second differential transistor pair being connected to said second input terminal, a base of said second second conductivity type bipolar transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a collector of said first second conductivity type bipolar transistor of said second differential transistor pair, a gate connected to said collector of said first second conductivity type bipolar transistor of said second differential transistor pair, and said second first conductivity type MOS transistor having a source connected to said high voltage line, a drain connected to a collector of said second second conductivity type bipolar transistor of said second differential transistor pair and also connected to said gate of said first conductivity type MOS transistor as said second transistor of said intermediate circuitry, and a gate connected to said gate of said first first conductivity type MOS transistor of said third current mirror circuit.

42. The operational amplifier as claimed in claim 29, wherein said first transistor comprises a second conductivity type MOS transistor having a source connected to said low voltage line, and a drain connected to said first constant current source and also connected to a gate of said second conductivity type MOS transistor in said output stage;

said first constant current source is connected to said high voltage line, said second transistor comprises a first conductivity type MOS transistor having a source connected to said high voltage line, a drain connected to said second constant current source and also connected to a gate of said second conductivity type MOS transistor as said first transistor and a gate connected to said input stage and also connected to a gate of said first conductivity type MOS transistor in said output stage; and said second constant current source is connected to said low voltage line.

43. The operational amplifier as claimed in claim 42, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

44. The operational amplifier as claimed in claim 43, wherein said first differential amplifier circuit comprises:

a first differential transistor pair of first and second first conductivity type MOS transistors connected to each other via sources thereof which are connected via a constant current source to said high voltage line, a gate of said first first conductivity type MOS transistor of said first differential transistor pair being connected to said first input terminal, a gate of said second first conductivity type MOS transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a drain of said first first conductivity type MOS transistor of said first differential transistor pair, and a gate connected to said drain of said first first conductivity type MOS transistor of said first differential transistor pair, and said second second conductivity type MOS transistor having a source connected to said low voltage line, a drain connected to said second differential amplifier circuit, and a gate connected to said gate of said first first conductivity type MOS transistor of said first differential transistor pair;

a second current mirror circuit comprising a pair of third and fourth first conductivity type MOS transistors, said third second conductivity type MOS transistor having a source connected to said low voltage line, a drain connected to a drain of said second first conductivity type MOS transistor of said first differential transistor pair, and a gate connected to said drain of said second first conductivity type MOS transistor of said first differential transistor pair, and said fourth second conductivity type MOS transistor having a source connected to said low voltage line, a drain connected to said second differential amplifier circuit and also connected to said gate of said first conductivity type MOS transistor as said second transistor of said intermediate circuitry, and a gate connected to said gate of said second first conductivity type MOS transistor of said first differential transistor pair; and wherein said second differential amplifier circuit comprises:

a second differential transistor pair of first and second second conductivity type MOS transistors connected to each other via sources thereof which are connected via a constant current source to said low voltage line, a gate of said first second conductivity type MOS transistor of said second differential transistor pair being connected to said second input terminal, a gate of said second second conductivity type MOS transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a drain of said first second conductivity type MOS transistor of said second differential transistor pair, a gate connected to said drain of said first second conductivity type MOS transistor of said second differential transistor pair, and said second first conductivity type MOS transistor having a source connected to said high voltage line, a drain connected to a drain of said second second conductivity type MOS transistor of said second differential transistor pair and also connected to said gate of said first conductivity type MOS transistor as said second transistor of said intermediate circuitry, and a gate connected to said gate of said first second conductivity type MOS transistor of said second differential transistor pair.

45. The operational amplifier as claimed in claim 43, wherein said first differential amplifier circuit comprises:

a first differential transistor pair of first and second first conductivity type bipolar transistors connected to each other via emitters thereof which are connected via a constant current source to said high voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a collector of said first first conductivity type bipolar transistor of said first differential transistor pair, and a gate connected to said collector of said first first conductivity type bipolar transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth second conductivity type MOS transistors, said third second conductivity type MOS transistor having a source connected to said low voltage line, a drain connected to a collector of said second first conductivity type bipolar transistor of said first differential transistor pair, and a gate connected to said collector of said second first conductivity type bipolar transistor of said first differential transistor pair, and said fourth second conductivity type MOS transistor having a source connected to said low voltage line, a drain connected to said second differential amplifier circuit and also connected to said gate of said first conductivity type MOS transistor as said second transistor of said intermediate circuitry, and a gate connected to said gate of said first second conductivity type MOS transistor of said second current mirror circuit; and wherein said second differential amplifier circuit comprises:

a second differential transistor pair of first and second second conductivity type bipolar transistors connected to each other via emitters thereof which are connected via a constant current source to said low voltage line, a base of said first second conductivity type bipolar transistor of said second differential transistor pair being connected to said second input terminal, a base of said second second conductivity type bipolar transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a collector of said first second conductivity type bipolar transistor of said second differential transistor pair, a gate connected to said collector of said first second conductivity type bipolar transistor of said second differential transistor pair, and said second first conductivity type MOS transistor having a source connected to said high voltage line, a drain connected to a collector of said second second conductivity type bipolar transistor of said second differential transistor pair and also connected to said gate of said first conductivity type MOS transistor as said second transistor of said intermediate circuitry, and a gate connected to said gate of said first first conductivity type MOS transistor of said third current mirror circuit.

46. The operational amplifier as claimed in claim 27, wherein said output stage comprises a first conductivity type MOS transistor and an second conductivity type bipolar transistor, both of which are connected in series to each other between said high voltage line and said low voltage line, said first conductivity type MOS transistor is connected to said high voltage line and said second conductivity type bipolar transistor is connected to said low voltage line.

47. The operational amplifier as claimed in claim 46, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises an second conductivity type bipolar transistor having an emitter connected to said low voltage line, a collector connected to said second constant current source and also connected to a gate of said second conductivity type MOS transistor as said first transistor and a base connected to said input stage and also connected to a base of said second conductivity type bipolar transistor in said output stage; and said second constant current source is connected to said high voltage line.

48. The operational amplifier as claimed in claim 47, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said second conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said second conductivity type bipolar transistor in said output stage.

49. The operational amplifier as claimed in claim 48, wherein said first differential amplifier circuit comprises:

a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;

a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected to said second differential amplifier circuit and also connected to said base of said second conductivity type bipolar transistor as said second transistor of said intermediate circuitry, and a gate connected to said gate of said second second conductivity type MOS transistor of said first differential transistor pair; and wherein said second differential amplifier circuit comprises:

a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said base of said second conductivity type bipolar transistor as said second transistor of said intermediate circuitry, and a gate connected to said gate of said first first conductivity type MOS transistor of said second differential transistor pair.

50. The operational amplifier as claimed in claim 48, wherein said first differential amplifier circuit comprises:

a first differential transistor pair of first and second second conductivity type bipolar transistors connected to each other via emitters thereof which are connected via a constant current source to said low voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a collector of said first second conductivity type bipolar transistor of said first differential transistor pair, and a gate connected to said collector of said first second conductivity type bipolar transistor of said first differential transistor pair, and said second first conductivity type MOS transistor having a source connected to said high voltage line, a drain connected to said second differential amplifier circuit, and a gate connected to said collector of said first second conductivity type bipolar transistor of said first differential transistor pair;

a second current mirror circuit comprising a pair of third and fourth first conductivity type MOS transistors, said third first conductivity type MOS transistor having a source connected to said high voltage line, a drain connected to a collector of said second second conductivity type bipolar transistor of said first differential transistor pair, and a gate connected to said collector of said second second conductivity type bipolar transistor of said first differential transistor pair, and said fourth first conductivity type MOS transistor having a source connected to said high voltage line, a drain connected to said second differential amplifier circuit and also connected to said base of said second conductivity type bipolar transistor as said second transistor of said intermediate circuitry, and a gate connected to said collector of said second second conductivity type bipolar transistor of said first differential transistor pair; and wherein said second differential amplifier circuit comprises:

a second differential transistor pair of first and second first conductivity type bipolar transistors connected to each other via emitters thereof which are connected via a constant current source to said high voltage line, a base of said first first conductivity type bipolar transistor of said second differential transistor pair being connected to said second input terminal, a gate of said second first conductivity type bipolar transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a collector of said first first conductivity type bipolar transistor of said second differential transistor pair, a gate connected to said collector of said first first conductivity type bipolar transistor of said second differential transistor pair, and said second second conductivity type MOS transistor having a source connected to said low voltage line, a drain connected to a collector of said second first conductivity type bipolar transistor of said second differential transistor pair and also connected to said base of said second conductivity type bipolar transistor as said second transistor of said intermediate circuitry, and a gate connected to said collector of said first first conductivity type bipolar transistor of said second differential transistor pair.

51. The operational amplifier as claimed in claim 46, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line;

said second transistor comprises an second conductivity type bipolar transistor having an emitter connected to said low voltage line, a collector connected to said second constant current source and also connected to a gate of said first conductivity type MOS transistor as said first transistor and a base connected to said input stage and also connected to a base of said second conductivity type bipolar transistor in said output stage; and said second constant current source is connected to said high voltage line.

52. The operational amplifier as claimed in claim 51, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said second conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said second conductivity type bipolar transistor in said output stage.

53. The operational amplifier as claimed in claim 52, wherein said first differential amplifier circuit comprises:

a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;

a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected to said second differential amplifier circuit and also connected to said base of said second conductivity type bipolar transistor as said second transistor of said intermediate circuitry, and a gate connected to said gate of said second second conductivity type MOS transistor of said first differential transistor pair; and wherein said second differential amplifier circuit comprises:

a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said base of said second conductivity type bipolar transistor as said second transistor of said intermediate circuitry, and a gate connected to said gate of said first first conductivity type MOS transistor of said second differential transistor pair.

54. The operational amplifier as claimed in claim 52, wherein said first differential amplifier circuit comprises:

a first differential transistor pair of first and second second conductivity type bipolar transistors connected to each other via emitters thereof which are connected via a constant current source to said low voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a collector of said first second conductivity type bipolar transistor of said first differential transistor pair, and a gate connected to said collector of said first second conductivity type bipolar transistor of said first differential transistor pair, and said second first conductivity type MOS transistor having a source connected to said high voltage line, a drain connected to said second differential amplifier circuit, and a gate connected to said collector of said first second conductivity type bipolar transistor of said first differential transistor pair;

a second current mirror circuit comprising a pair of third and fourth first conductivity type MOS transistors, said third first conductivity type MOS transistor having a source connected to said high voltage line, a drain connected to a collector of said second second conductivity type bipolar transistor of said first differential transistor pair, and a gate connected to said collector of said second second conductivity type bipolar transistor of said first differential transistor pair, and said fourth first conductivity type MOS transistor having a source connected to said high voltage line, a drain connected to said second differential amplifier circuit and also connected to said base of said second conductivity type bipolar transistor as said second transistor of said intermediate circuitry, and a gate connected to said collector of said second second conductivity type bipolar transistor of said first differential transistor pair; and wherein said second differential amplifier circuit comprises:

a second differential transistor pair of first and second first conductivity type bipolar transistors connected to each other via emitters thereof which are connected via a constant current source to said high voltage line, a base of said first first conductivity type bipolar transistor of said second differential transistor pair being connected to said second input terminal, a gate of said second first conductivity type bipolar transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a collector of said first first conductivity type bipolar transistor of said second differential transistor pair, a gate connected to said collector of said first first conductivity type bipolar transistor of said second differential transistor pair, and said second second conductivity type MOS transistor having a source connected to said low voltage line, a drain connected to a collector of said second first conductivity type bipolar transistor of said second differential transistor pair and also connected to said base of said second conductivity type bipolar transistor as said second transistor of said intermediate circuitry, and a gate connected to said collector of said first first conductivity type bipolar transistor of said second differential transistor pair.

55. The operational amplifier as claimed in claim 27, wherein said output stage comprises a second conductivity type MOS transistor and a first conductivity type bipolar transistor, both of which are connected in series to each other between said high voltage line and said low voltage line, said second conductivity type MOS transistor is connected to said low voltage line and said first conductivity type bipolar transistor is connected to said high voltage line.

56. The operational amplifier as claimed in claim 55, wherein said first transistor comprises a first conductivity type MOS transistor having a source connected to said high voltage line, and a drain connected to said first constant current source and also connected to a gate of said second conductivity type MOS transistor in said output stage;

said first constant current source is connected to said low voltage line;

said second transistor comprises a first conductivity type bipolar transistor having an emitter connected to said high voltage line, a drain connected to said second constant current source and also connected to a gate of said first conductivity type MOS transistor as said first transistor and a base connected to said input stage and also connected to a base of said first conductivity type bipolar transistor in said output stage; and said second constant current source is connected to said low voltage line.

57. The operational amplifier as claimed in claim 56, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said first conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said first conductivity type bipolar transistor in said output stage.

58. The operational amplifier as claimed in claim 57, wherein said first differential amplifier circuit comprises:

a first differential transistor pair of first and second first conductivity type MOS transistors connected to each other via sources thereof which are connected via a constant current source to said high voltage line, a gate of said first first conductivity type MOS transistor of said first differential transistor pair being connected to said first input terminal, a gate of said second first conductivity type MOS transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a drain of said first first conductivity type MOS transistor of said first differential transistor pair, and a gate connected to said drain of said first first conductivity type MOS transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth first conductivity type MOS transistors, said third second conductivity type MOS transistor having a source connected to said low voltage line, a drain connected to a drain of said second first conductivity type MOS transistor of said first differential transistor pair, and a gate connected to said drain of said second first conductivity type MOS transistor of said first differential transistor pair, and said fourth second conductivity type MOS transistor having a source connected to said low voltage line, a drain connected to said second differential amplifier circuit and also connected to said base of said first conductivity type bipolar transistor as said second transistor of said intermediate circuitry, and a gate connected to said gate of said second second conductivity type MOS transistor of said second current mirror circuit; and wherein said second differential amplifier circuit comprises:

a second differential transistor pair of first and second second conductivity type MOS transistors connected to each other via sources thereof which are connected via a constant current source to said low voltage line, a gate of said first second conductivity type MOS transistor of said second differential transistor pair being connected to said second input terminal, a gate of said second second conductivity type MOS transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a drain of said first second conductivity type MOS transistor of said second differential transistor pair, a gate connected to said drain of said first second conductivity type MOS transistor of said second differential transistor pair, and said second first conductivity type MOS transistor having a source connected to said high voltage line, a drain connected to a drain of said second second conductivity type MOS transistor of said second differential transistor pair and also connected to said base of said first conductivity type bipolar transistor as said second transistor of said intermediate circuitry, and a gate connected to said gate of said first second conductivity type MOS transistor of said second differential transistor pair.

59. The operational amplifier as claimed in claim 57, wherein said first differential amplifier circuit comprises:

a first differential transistor pair of first and second first conductivity type bipolar transistors connected to each other via emitters thereof which are connected via a constant current source to said high voltage line, a base of said first second conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a collector of said first first conductivity type bipolar transistor of said first differential transistor pair, and a gate connected to said collector of said first first conductivity type bipolar transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth second conductivity type MOS transistors, said third second conductivity type MOS transistor having a source connected to said low voltage line, a drain connected to a collector of said second first conductivity type bipolar transistor of said first differential transistor pair, and a gate connected to said collector of said second first conductivity type bipolar transistor of said first differential transistor pair, and said fourth second conductivity type MOS transistor having a source connected to said low voltage line, a drain connected to said second differential amplifier circuit and also connected to said base of said first conductivity type bipolar transistor as said second transistor of said intermediate circuitry, and a gate connected to said gate of said first second conductivity type MOS transistor of said second current mirror circuit; and wherein said second differential amplifier circuit comprises:

a second differential transistor pair of first and second second conductivity type bipolar transistors connected to each other via emitters thereof which are connected via a constant current source to said low voltage line, a base of said first second conductivity type bipolar transistor of said second differential transistor pair being connected to said second input terminal, a base of said second second conductivity type bipolar transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a collector of said first second conductivity type bipolar transistor of said second differential transistor pair, a gate connected to said collector of said first second conductivity type bipolar transistor of said second differential transistor pair, and said second first conductivity type MOS transistor having a source connected to said high voltage line, a drain connected to a collector of said second second conductivity type bipolar transistor of said second differential transistor pair and also connected to said base of said first conductivity type bipolar transistor as said second transistor of said intermediate circuitry, and a gate connected to said gate of said first first conductivity type MOS transistor of said third current mirror circuit.

60. The operational amplifier as claimed in claim 55, wherein said first transistor comprises a second conductivity type MOS transistor having a source connected to said low voltage line, and a drain connected to said first constant current source and also connected to a gate of said second conductivity type MOS transistor in said output stage;

said first constant current source is connected to said high voltage line;

said second transistor comprises a first conductivity type bipolar transistor having an emitter connected to said high voltage line, a collector connected to said second constant current source and also connected to a gate of said second conductivity type MOS transistor as said first transistor and a base connected to said input stage and also connected to a base of said first conductivity type bipolar transistor in said output stage; and said second constant current source is connected to said low voltage line.

61. The operational amplifier as claimed in claim 60, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said base of said second transistor of said intermediate circuitry and also connected to said first conductivity type bipolar transistor in said output stage; and a second differential amplifier circuit being connected to said first input terminal and said second input terminal, said second differential amplifier circuit being biased between said high voltage line and said low voltage line, an output of said second differential amplifier being connected to said base of said second transistor of said intermediate circuitry and also connected to said first conductivity type bipolar transistor in said output stage.

62. The operational amplifier as claimed in claim 61, wherein said first differential amplifier circuit comprises:

a first differential transistor pair of first and second first conductivity type MOS transistors connected to each other via sources thereof which are connected via a constant current source to said high voltage line, a gate of said first first conductivity type MOS transistor of said first differential transistor pair being connected to said first input terminal, a gate of said second first conductivity type MOS transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a drain of said first first conductivity type MOS transistor of said first differential transistor pair, and a gate connected to said drain of said first first conductivity type MOS transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth first conductivity type MOS transistors, said third second conductivity type MOS transistor having a source connected to said low voltage line, a drain connected to a drain of said second first conductivity type MOS transistor of said first differential transistor pair, and a gate connected to said drain of said second first conductivity type MOS transistor of said first differential transistor pair, and said fourth second conductivity type MOS transistor having a source connected to said low voltage line, a drain connected to said second differential amplifier circuit and also connected to said base of said first conductivity type bipolar transistor as said second transistor of said intermediate circuitry, and a gate connected to said gate of said second second conductivity type MOS transistor of said second current mirror circuit; and wherein said second differential amplifier circuit comprises:

a second differential transistor pair of first and second second conductivity type MOS transistors connected to each other via sources thereof which are connected via a constant current source to said low voltage line, a gate of said first second conductivity type MOS transistor of said second differential transistor pair being connected to said second input terminal, a gate of said second second conductivity type MOS transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a drain of said first second conductivity type MOS transistor of said second differential transistor pair, a gate connected to said drain of said first second conductivity type MOS transistor of said second differential transistor pair, and said second first conductivity type MOS transistor having a source connected to said high voltage line, a drain connected to a drain of said second second conductivity type MOS transistor of said second differential transistor pair and also connected to said base of said first conductivity type bipolar transistor as said second transistor of said intermediate circuitry, and a gate connected to said gate of said first second conductivity type MOS transistor of said second differential transistor pair.

63. The operational amplifier as claimed in claim 61, wherein said first differential amplifier circuit comprises:

a first differential transistor pair of first and second first conductivity type bipolar transistors connected to each other via emitters thereof which are connected via a constant current source to said high voltage line, a base of said first first conductivity type bipolar transistor of said first differential transistor pair being connected to said first input terminal, a base of said second second conductivity type bipolar transistor of said first differential transistor pair being connected to said second input terminal;

a first current mirror circuit comprising a pair of first and second second conductivity type MOS transistors, said first second conductivity type MOS transistor having a source connected to said low voltage line, a drain connected to a collector of said first first conductivity type bipolar transistor of said first differential transistor pair, and a gate connected to said collector of said first first conductivity type bipolar transistor of said first differential transistor pair, and said second second conductivity type MOS transistor having a source connected to said low voltage line, a drain connected to said second differential amplifier circuit, and a gate connected to said gate of said first second conductivity type MOS transistor of said first current mirror circuit;

a second current mirror circuit comprising a pair of third and fourth second conductivity type MOS transistors, said third second conductivity type MOS transistor having a source connected to said low voltage line, a drain connected to a collector of said second first conductivity type bipolar transistor of said first differential transistor pair, and a gate connected to said collector of said second first conductivity type bipolar transistor of said first differential transistor pair, and said fourth second conductivity type MOS transistor having a source connected to said low voltage line, a drain connected to said second differential amplifier circuit and also connected to said base of said first conductivity type bipolar transistor as said second transistor of said intermediate circuitry, and a gate connected to said gate of said first second conductivity type MOS transistor of said second current mirror circuit; and wherein said second differential amplifier circuit comprises:

a second differential transistor pair of first and second second conductivity type bipolar transistors connected to each other via emitters thereof which are connected via a constant current source to said low voltage line, a base of said first second conductivity type bipolar transistor of said second differential transistor pair being connected to said second input terminal, a base of said second second conductivity type bipolar transistor of said second differential transistor pair being connected to said first input terminal; and a third current mirror circuit comprising a pair of first and second first conductivity type MOS transistors, said first first conductivity type MOS transistor having a source connected to said high voltage line, a drain connected to a collector of said first second conductivity type bipolar transistor of said second differential transistor pair, a gate connected to said collector of said first second conductivity type bipolar transistor of said second differential transistor pair, and said second first conductivity type MOS transistor having a source connected to said high voltage line, a drain connected to a collector of said second second conductivity type bipolar transistor of said second differential transistor pair and also connected to said base of said first conductivity type bipolar transistor as said second transistor of said intermediate circuitry, and a gate connected to said gate of said first first conductivity type MOS transistor of said third current mirror circuit.

64. The operational amplifier as claimed in claim 27, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, wherein said input stage includes at least a differential amplifier circuit, wherein said first transistor comprises a second conductivity type MOS transistor having a source connected to said low voltage line, and a drain connected to said first constant current source and also connected to a gate of said first conductivity type MOS transistor in said output stage;

said first constant current source is connected to said high voltage line;

said second transistor comprises a second conductivity type MOS transistor having a source connected to said low voltage line, a drain connected to said second constant current source and also connected to a gate of said second conductivity type MOS transistor as said first transistor and a gate connected to said input stage and also connected to a gate of said second conductivity type MOS transistor in said output stage; and said second constant current source is connected to said high voltage line, and wherein said intermediate circuitry further comprises a first additional second conductivity type MOS transistor having a source connected to said source of said second conductivity type MOS transistor as said second transistor, a drain connected to said drain of said second conductivity type MOS transistor as said second transistor, and a gate connected to said gate of said second conductivity type MOS transistor as said first transistor and also connected to said drain of said second conductivity type MOS transistor as said second transistor.

65. The operational amplifier as claimed in claim 64, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

66. The operational amplifier as claimed in claim 64, further comprising a first additional first conductivity type MOS transistor having a source connected to said first constant current source, a drain connected to said drain of said second conductivity type MOS transistor as said first transistor, and a gate connected to said gate of said first conductivity type MOS transistor in said output stage.

67. The operational amplifier as claimed in claim 64, further comprising a second additional second conductivity type MOS transistor having a source connected to said source of said second conductivity type MOS transistor as said first transistor, a drain connected to said drain of said second conductivity type MOS transistor as said first transistor, and a gate connected to said drain of said second conductivity type MOS transistor as said first transistor.

68. The operational amplifier as claimed in claim 65, wherein said first differential amplifier circuit comprises:

a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;

a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected said second differential amplifier circuit and also connected to said gate of said second conductivity type MOS transistor as said second transistor of said intermediate circuitry, and a gate connected to said gate of said second second conductivity type MOS transistor of said first differential transistor pair; and wherein said second differential amplifier circuit comprises:

a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said gate of said second conductivity type MOS transistor as said second transistor of said intermediate circuitry, and a gate connected to said gate of said first first conductivity type MOS transistor of said second differential transistor pair.

69. The operational amplifier as claimed in claim 27, wherein said output stage comprises a complementary MOS circuit having a first conductivity type MOS transistor and a second conductivity type MOS transistor, both of which are connected in series to each other between said high voltage line and said low voltage line, said first conductivity type MOS transistor is connected to said high voltage line, and said second conductivity type MOS transistor is connected to said low voltage line, wherein said input stage includes at least a differential amplifier circuit, wherein said first transistor comprises a first conductivity type MOS transistor having a source connected to said high voltage line, and a drain connected to said first constant current source and also connected to a gate of said first conductivity type MOS transistor in said output stage;

said first constant current source is connected to said low voltage line;

said second transistor comprises a second conductivity type MOS transistor having a source connected to said low voltage line, a drain connected to said second constant current source and also connected to a gate of said first conductivity type MOS transistor as said first transistor and a gate connected to said input stage and also connected to a gate of said second conductivity type MOS transistor in said output stage; and said second constant current source is connected to said high voltage line, and wherein said intermediate circuitry further comprises a first additional first conductivity type MOS transistor having a source connected to said source of said first conductivity type MOS transistor as said first transistor, a drain connected to said drain of said first conductivity type MOS transistor as said first transistor, and a gate connected to said gate of said first conductivity type MOS transistor in said output stage and also connected to said drain of said first conductivity type MOS transistor as said first transistor.

70. The operational amplifier as claimed in claim 69, wherein said input stage comprises:

a first input terminal for receiving first input signals;

a second input terminal for receiving second input signals;

a first differential amplifier circuit being connected to said first input terminal and said second input terminal, said first differential amplifier circuit being biased between said high voltage line and said low voltage line, an output of said first differential amplifier being connected to said gate of said second transistor of said intermediate circuitry and also connected to said second conductivity type MOS transistor in said output stage; and a second differential amplifier circuit being connected to said first input terminal and said second input terminal, said second differential amplifier circuit being biased between said high voltage line and said low voltage line, an output of said second differential amplifier being connected to said gate of said second transistor of said intermediate circuitry and also connected to said second conductivity type MOS transistor in said output stage.

71. The operational amplifier as claimed in claim 70, wherein said first differential amplifier circuit comprises:

a first differential transistor pair of first and second second conductivity type MOS transistors connected to each other via sources thereof which are connected via a constant current source to said low voltage line, a gate of said first second conductivity type MOS transistor of said first differential transistor pair being connected to said first input terminal, a gate of said second second conductivity type MOS transistor of said first differential transistor pair being connected to said second input terminal;

a first current mirror circuit comprising a pair of first and second first conductivity type MOS transistors, said first first conductivity type MOS transistor having a source connected to said high voltage line, a drain connected to a drain of said first second conductivity type MOS transistor of said first differential transistor pair, and a gate connected to said drain of said first second conductivity type MOS transistor of said first differential transistor pair, and said second first conductivity type MOS transistor having a source connected to said high voltage line, a drain connected to said second differential amplifier circuit, and a gate connected to said gate of said first second conductivity type MOS transistor of said first differential transistor pair;

a second current mirror circuit comprising a pair of third and fourth first conductivity type MOS transistors, said third first conductivity type MOS transistor having a source connected to said high voltage line, a drain connected to a drain of said second second conductivity type MOS transistor of said first differential transistor pair, and a gate connected to said drain of said second second conductivity type MOS transistor of said first differential transistor pair, and said fourth first conductivity type MOS transistor having a source connected to said high voltage line, a drain connected to said second differential amplifier circuit and also connected to said gate of said second conductivity type MOS transistor as said second transistor of said intermediate circuitry, and a gate connected to said gate of said second second conductivity type MOS transistor of said first differential transistor pair; and wherein said second differential amplifier circuit comprises:

a second differential transistor pair of first and second first conductivity type MOS transistors connected to each other via sources thereof which are connected via a constant current source to said high voltage line, a gate of said first first conductivity type MOS transistor of said second differential transistor pair being connected to said second input terminal, a gate of said second first conductivity type MOS transistor of said second differential transistor pair being connected to said first input terminal;

a third current mirror circuit comprising a pair of first and second second conductivity type MOS transistors, said first second conductivity type MOS transistor having a source connected to said low voltage line, a drain connected to a drain of said first first conductivity type MOS transistor of said second differential transistor pair, a gate connected to said drain of said first first conductivity type MOS transistor of said second differential transistor pair, and said second second conductivity type MOS transistor having a source connected to said low voltage line, a drain connected to a drain of said second first conductivity type MOS transistor of said second differential transistor pair and also connected to said gate of said second conductivity type MOS transistor as said second transistor of said intermediate circuitry, and a gate connected to said gate of said first first conductivity type MOS transistor of said second differential transistor pair.

\* \* \* \* \*